(12) United States Patent  
Sakuta et al.

(10) Patent No.: US 8,829,780 B2
(45) Date of Patent: Sep. 9, 2014

(54) WHITE SEMICONDUCTOR LIGHT EMITTING DEVICE

(75) Inventors: Hiroaki Sakuta, Odawara (JP); Kazuhiko Kagawa, Tokyo (JP); Yoshihito Satou, Ushiku (JP); Shin Hiraoka, Yokohama (JP)

(73) Assignee: Mitsubishi Chemical Corporation, Tokyo (JP)

( * ) Notice: Subject to any disclaimer, the term of this patent is extended or adjusted under 35 U.S.C. 154(b) by 225 days.

(21) Appl. No.: 13/571,538

(22) Filed: Aug. 10, 2012

(65) Prior Publication Data

US 2012/0319565 A1 Dec. 20, 2012

Related U.S. Application Data

(63) Continuation of application No. PCT/JP2011/064567, filed on Jun. 24, 2011.

(30) Foreign Application Priority Data

Jun. 25, 2010 (JP) ................... 2010-145095
Aug. 9, 2010 (JP) ................... 2010-179063
Dec. 15, 2010 (JP) ................... 2010-279901

(51) Int. Cl.
*H01J 1/62* (2006.01)
*C09K 11/77* (2006.01)
*C09K 11/08* (2006.01)
*H01L 25/075* (2006.01)
*H01L 33/50* (2010.01)

(52) U.S. Cl.
CPC .......... *H01L 33/504* (2013.01); *C09K 11/7768* (2013.01); *H01L 2224/32225* (2013.01); *C09K 11/7734* (2013.01); *H01L 25/0753* (2013.01); *H01L 2924/01021* (2013.01); *C09K 11/7774* (2013.01); *H01L 2924/01019* (2013.01); *H01L 2224/48227* (2013.01); *H01L 2224/73265* (2013.01); *C09K 11/0883* (2013.01); *H01L 33/507* (2013.01); *H01L 2224/45144* (2013.01); *C09K 11/7739* (2013.01); *H01L 2224/48091* (2013.01)
USPC ........................................... 313/503; 313/501

(58) Field of Classification Search
CPC ..... H01L 33/502; H01L 33/504; H01L 33/50; H01L 33/501
USPC .................................................. 313/498–503
See application file for complete search history.

(56) References Cited

U.S. PATENT DOCUMENTS

| | | | |
|---|---|---|---|
| 7,391,060 B2 | 6/2008 | Oshio | |
| 7,544,310 B2 | 6/2009 | Hirosaki | |
| 7,678,294 B2 | 3/2010 | Hirosaki | |
| 7,780,872 B2 | 8/2010 | Hirosaki | |
| 8,123,980 B2 | 2/2012 | Kijima et al. | |
| 8,206,611 B2 | 6/2012 | Hirosaki et al. | |
| 8,663,502 B2 * | 3/2014 | Tao et al. | 252/301.4 F |
| 2007/0007494 A1 | 1/2007 | Hirosaki et al. | |
| 2007/0259206 A1 * | 11/2007 | Oshio | 428/690 |
| 2008/0128654 A1 * | 6/2008 | Oshio | 252/301.4 R |
| 2008/0150412 A1 | 6/2008 | Yoshimatsu | |
| 2009/0072255 A1 | 3/2009 | Takahashi et al. | |
| 2009/0096361 A1 | 4/2009 | Fukuda et al. | |
| 2010/0244076 A1 | 9/2010 | Schmidt et al. | |
| 2012/0112626 A1 | 5/2012 | Sakuta et al. | |
| 2012/0212123 A1 | 8/2012 | Sakuta et al. | |

FOREIGN PATENT DOCUMENTS

| | | |
|---|---|---|
| JP | 2004-103443 | 4/2004 |
| JP | 2005-255895 | 9/2005 |
| JP | 2006-008721 | 1/2006 |
| JP | 2006-049799 | 2/2006 |
| JP | 2007-231245 | 9/2007 |
| JP | 2008-007751 | 1/2008 |
| JP | 2008-150549 | 7/2008 |
| JP | 2008-218485 | 9/2008 |
| JP | 2008-270781 | 11/2008 |
| JP | 2008-300124 | 12/2008 |
| JP | 2009-081288 | 4/2009 |
| WO | WO 2007/105631 | 9/2007 |
| WO | WO 2009/072043 | 6/2009 |

OTHER PUBLICATIONS

U.S. Appl. No. 13/673,568, filed Nov. 9, 2012, Sakuta, et al.
U.S. Appl. No. 13/918,514, filed Jun. 14, 2013, Sakuta, et al.

U.S. Appl. No. 13/832,713, filed Mar. 15, 2013, Sakuta, et al.
International Preliminary Report on Patentability and Written Opinion issued Jan. 24, 2013, in International Application No. PCT/JP2011/064567.
International Search Report issued Jul. 26, 2011 in PCT/JP2011/064567 filed Jun. 24, 2011.
G. Chen, et al.; "Performance of high-power III-nitride light emitting diodes"; phys. stat. sol. (a), 2008, vol. 205, No. 5, pp. 1086-1092.
U.S. Appl. No. 13/457,164, filed Apr. 26, 2012, Sakuta, et al.
U.S. Appl. No. 13/411,012, filed Mar. 2, 2012, Sakuta, et al.

\* cited by examiner

*Primary Examiner* — Anne Hines
(74) *Attorney, Agent, or Firm* — Oblon, Spivak, McClelland, Maier & Neustadt, L.L.P.

(57) ABSTRACT

The invention aims at providing controllable parameters that are correlated with special color rendering index R9, and at providing a white-light emitting semiconductor device having a high R9 value obtained through optimization of such parameters. The white-light emitting semiconductor device is provided with a phosphor as a light-emitting material and with a light-emitting semiconductor element as an excitation source of the phosphor. The phosphor includes at least a green phosphor and a wide-band red phosphor. In the white light-emitting semiconductor device, an intensity at wavelength 640 nm of an emission spectrum which has been normalized with respect to luminous flux is 100-110% of the intensity at wavelength 640 nm of a spectrum of standard light for color rendering evaluation which has been normalized with respect to luminous flux.

14 Claims, 44 Drawing Sheets

(a)

(b)

WHITE SEMICONDUCTOR LIGHT EMITTING DEVICE

BACKGROUND OF THE INVENTION

1. Field of the Invention

The present invention relates to white light-emitting devices which output white light suitable for illumination. More particularly, the invention relates to white light-emitting semiconductor devices which are equipped with phosphors as light-emitting factors and with a light-emitting semiconductor element as an excitation source for the phosphors.

In the invention and in this description, light having a color which has deviations Duv from the black-body radiation locus in the range of −20 to +20 is called white light. The definition of Duv (=1,000 duv) is in accordance with JIS Z8725:1999 "Method for Determining Distribution Temperature and Color Temperature or Correlated Color Temperature of Light Sources".

2. Description of the Related Art

White LEDs configured so as to output white light on the basis of a combination of a gallium nitride-based light-emitting diode (LED) element and a phosphor have recently come to be used also as a light source of an illumination.

In illumination applications, there is a demand for white LEDs having a color temperature of 3500 K or lower (Patent Document 1). A major factor that has made it possible to produce such low color temperature white LEDs, which exhibit also high luminance that allows the white LEDs to be used in illumination, has been the development of alkaline earth siliconitride-based high-luminance red phosphors that use $Eu^{2+}$ as an activator, for instance, $(Ca,Sr,Ba,Mg)AlSiN_3$:Eu, $(CaAlSiN_3)_{1-x}(Si_{(3n+2)/4}N_nO)_x$:Eu or the like (Patent Documents 2 to 4). These red phosphors are wide-band red phosphor which has a broad emission spectrum exhibiting full width at half maximum ranging from 80 to 120 nm. Thus, white LEDs having an average color rendering index (CRI) in excess of 80 can be produced by combining a blue LED element, as an excitation source and a generation source of blue light, and using a green phosphor as a generation source of green light.

By contrast, no thorough studies have been conducted thus far with the aim of improving the special color rendering index R9 of white LEDs. Herein, R9 is an index of reproducibility relating to high-saturation red. There is a strong demand for improved R9 in so-called warm white LEDs, which are white LEDs having a color temperature ranging from 2500 to 3500 K.

Patent Document 5 sets forth an example of the production of a white LED having a color temperature of 3800 K and R9=83, through combination of specific blue phosphors, green phosphors and red phosphors with a purple LED element.

Patent Document 1: JP-A-2004-103443
Patent Document 2: JP-A-2006-8721
Patent Document 3: JP-A-2008-7751
Patent Document 4: JP-A-2007-231245
Patent Document 5: JP-A-2006-49799
Patent Document 6: International Publication No. 2007-105631, pamphlet
Patent Document 7: International Publication No. 2009-072043, pamphlet
Patent Document 8: JP-A-2008-150549
Non-Patent Document 1: G. Chen, et al., Phys. Stat. Sol. (a) 205, No. 5, 1086-1092 (2008)

Various reports have been forthcoming on the production of white LEDs that exhibit high special color rendering index R9, by virtue of a combination of specific phosphors and a light-emitting semiconductor element. In most such reported cases, the phosphors are specified based on their formulas and emission peak wavelengths. However, it is a well-known fact that, even in phosphors that are represented by the same formula, dissimilar activator concentrations and dissimilar composition ratios of the elements that make up a base crystal result in dissimilar emission characteristics (peak wavelength of the emission spectrum, full width at half maximum and so forth). The inventors have also found, through experimentation, that the R9 value of white LEDs is not determined only by the emission peak wavelength of the phosphors that are used. Accordingly, it may be said that no design guidelines for white LEDs having high R9 values have been available thus far; what is more, reproducing the high R9 values of the reported white LEDs is far from easy.

SUMMARY OF THE INVENTION

In the light of the above, the main objects of the present invention are to provide controllable parameters that are correlated with the special color rendering index R9, and to provide a white light-emitting semiconductor device that has a high R9 value and that is obtained through optimization of such parameters.

The inventors found that the special color rendering index R9 takes on a high value, of 85 or greater, in a white light-emitting semiconductor device that utilizes a wide-band red phosphor, when the following conditions are satisfied.

Specifically, the intensity at wavelength 640 nm of the emission spectrum, which has been normalized with respect to luminous flux, of the white light-emitting semiconductor device, is 100-110% of the intensity at wavelength 640 nm of a spectrum of standard light for color rendering evaluation which has been normalized with respect to luminous flux; and arrived at the present invention on the basis of that finding.

Essential points of the present invention are as follows.

(1) A white light-emitting semiconductor device comprising a phosphor as a light-emitting material and with a light-emitting semiconductor element, as an excitation source of the phosphor, and the phosphor includes at least a green phosphor and a wide-band red phosphor, wherein said green phosphor includes at least one type of green phosphor selected from among a green phosphor that contains a crystal formed of an alkaline earth silicon oxynitride or Sialon as a base and that contains $Eu^{2+}$ as an activator, and a green phosphor that contains $Ce^{3+}$ as an activator; and an intensity at wavelength 640 nm of an emission spectrum which has been normalized with respect to luminous flux is 100-110% of the intensity at wavelength 640 nm of a spectrum of standard light for color rendering evaluation which has been normalized with respect to luminous flux.

(2) The white light-emitting semiconductor device according to (1), wherein the correlated color temperature of emitted white light ranges from 2500 to 3500 K.

(3) The white light-emitting semiconductor device according to (1) or (2), wherein said green phosphor includes β-Sialon:Eu.

(4) The white light-emitting semiconductor device according to any one of (1) to (3), wherein an emission peak wavelength of said light-emitting semiconductor element ranges from 360 to 430 nm, said phosphor further includes a blue phosphor, and the white light-emitting semiconductor device emits white light that includes light respectively emitted by said blue phosphor, said green phosphor and said wide-band red phosphor.

(5) The white light-emitting semiconductor device according to (4), wherein said light-emitting semiconductor element is an InGaN-based LED element, the emission peak wavelength of which ranges from 405 to 415 nm.

(6) The white light-emitting semiconductor device according to (4) or (5), wherein said blue phosphor includes an alkaline earth halophosphate phosphor activated by $Eu^{2+}$.

(7) The white light-emitting semiconductor device according to any one of (1) to (3), wherein the emission peak wavelength of said light-emitting semiconductor element ranges from 430 to 470 nm.

(8) The white light-emitting semiconductor device according to any one of (1) to (7), wherein said phosphor further includes a yellow phosphor, and the white light-emitting semiconductor device emits white light that includes at least light respectively emitted by said green phosphor, said yellow phosphor and said wide-band red phosphor.

(9) The white light-emitting semiconductor device according to any one of (1) to (8), wherein said wide-band red phosphor includes $(CaAlSiN_3)_{1-x}(Si_{(3n+2)/4}N_nO)_x$:Eu.

(10) A white light-emitting semiconductor device, including: a first and second white light-emitting units, each of which includes a phosphor as a light-emitting material, and a light-emitting semiconductor element as an excitation source of the phosphor, and this phosphor includes at least a green phosphor and a wide-band red phosphor, wherein in each of said first and second white light-emitting units, an intensity at wavelength 640 nm of an emission spectrum which has been normalized with respect to luminous flux is 100-110% of the intensity at wavelength 640 nm of a spectrum of standard light for color rendering evaluation which has been normalized with respect to luminous flux, and the white light-emitting semiconductor device can emit combined secondary white light resulting from mixing of primary white light emitted by said first white light-emitting unit and primary white light emitted by said second white light-emitting unit.

(11) The white light-emitting semiconductor device according to (10), wherein a difference between the correlated color temperature of the primary white light emitted by said first white light-emitting unit and the correlated color temperature of the primary white light emitted by said second white light-emitting unit is 2000 K or more.

(12) The white light-emitting semiconductor device according to (11), wherein the correlated color temperature of the primary white light emitted by said first white light-emitting unit ranges from 2500 to 3500 K, and the correlated color temperature of the primary white light emitted by said second white light-emitting unit ranges from 4500 to 7000 K.

(13) A white light-emitting semiconductor device having first to N-th white light-emitting units, each of which includes a phosphor as a light-emitting material, and a light-emitting semiconductor element as an excitation source of the phosphor, and this phosphor includes at least a green phosphor and a wide-band red phosphor, this white light-emitting semiconductor device emitting combined secondary white light resulting from mixing of primary white light respectively emitted by said first to N-th white light-emitting units, wherein in all or part of said first to N-th white light-emitting units, said green phosphor includes at least one type of green phosphor selected from among a green phosphor that contains a crystal formed of an alkaline earth silicon oxynitride or Sialon as a base and that contains $EU^{2+}$ as an activator, and a green phosphor that contains $Ce^{3+}$ as an activator; and an intensity at wavelength 640 nm of a spectrum of the secondary white light which has been normalized with respect to luminous flux is 100-110% of the intensity at wavelength 640 nm of a spectrum of standard light for color rendering evaluation which has been normalized with respect to luminous flux. The abovementioned N is an integer equal to or greater than 2.

(14) The white light-emitting semiconductor device according to (13), wherein in all or part of said first to N-th white light-emitting units, the intensity at wavelength 640 nm of the emission spectrum which has been normalized with respect to luminous flux is 99% or less or 111% or more of the intensity at wavelength 640 nm of a spectrum of standard light for color rendering evaluation which has been normalized with respect to luminous flux. The abovementioned N is an integer equal to or greater than 2.

The white light-emitting semiconductor device of the present invention may be configured so as not to include at least one of the white light-emitting semiconductor devices in (i) to (iii) below.

(i) A white light-emitting semiconductor device, in which the outputted light of the white light-emitting semiconductor device has a spectrum which has a maximum wavelength in the range of 615-645 nm, and an intensity at a wave length of 580 nm of the spectrum of the outputted light which has been normalized with respect to luminous flux is 80-100% of an intensity at a wavelength of 580 nm of the spectrum of standard light for color rendering evaluation which has been normalized with respect to luminous flux.

(ii) A white light-emitting semiconductor device, in which the white light-emitting semiconductor device comprises a first red phosphor and a second red phosphor, and the second red phosphor has a lower relative intensity at a wavelength of 580 nm in an emission spectrum, when the intensity at the peak wavelength is taken as 1, than in the first red phosphor.

(iii) A white light-emitting semiconductor device, in which the white light-emitting semiconductor device has a phosphor comprising a blue phosphor having a chemical composition of formula [1] below, a green phosphor having an emission peak wavelength of 535 nm or greater, and at least one type of red phosphor selected from among an Eu-activated nitride phosphor and an Eu-activated oxynitride phosphor:

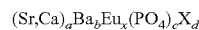

$$(Sr,Ca)_a Ba_b Eu_x (PO_4)_c X_d \qquad [1]$$

(In general formula [1], X is Cl; c, d and x are numbers satisfying 2.7≤c≤3.3, 0.9≤d≤1.1 and 0.3≤x≤1.2; and a and b satisfy the conditions a+b=5−x and 0.12≤b/(a+b)≤0.6.).

In some instances, the value of b/(a+b) in formula [1] in (iii) may be such that 0.05≤b/(a+b)≤0.4.

The white light-emitting semiconductor device having high special color rendering index R9 of the embodiments of the present invention can be appropriately used as a light source for high-color rendering illumination.

BRIEF DESCRIPTION OF THE DRAWINGS

FIG. 7 is a set of diagrams wherein FIG. 7(a) is a perspective-view diagram of a light-emitting module in which the white LED illustrated in FIG. 3 and FIG. 4 is mounted as a plurality thereof, and FIG. 7(b) is a diagram illustrating schematically the arrangement of the white LEDs in the light-emitting module.

DESCRIPTION OF THE EMBODIMENTS

The present invention is explained next for specific embodiments.

[1] Example 1

Figure 1:
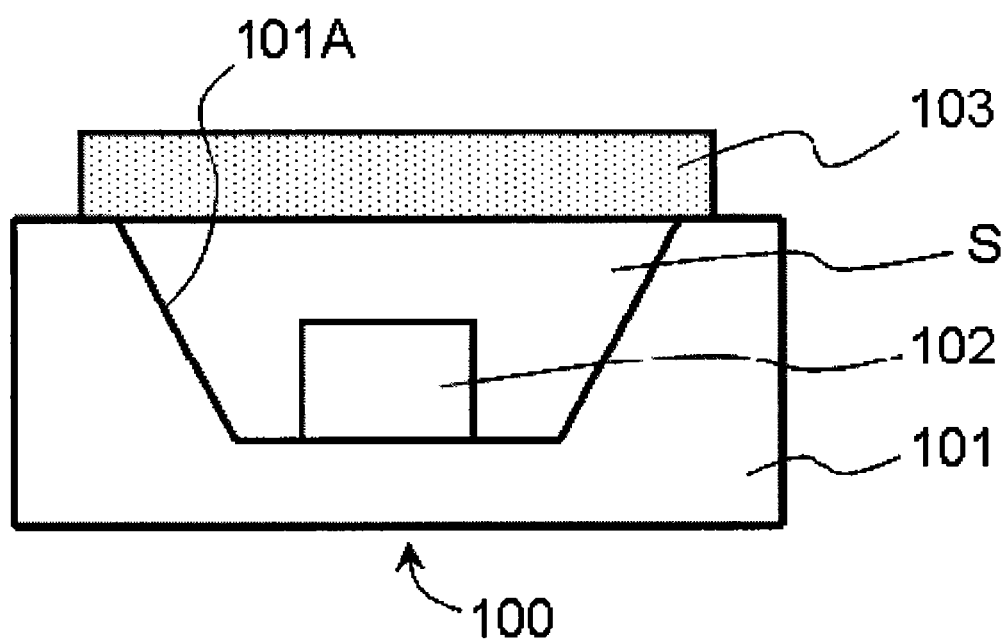
FIG. 1 is a cross-sectional diagram of a white light-emitting semiconductor device according to an embodiment of the present invention.

FIG. 1 is a cross-sectional diagram illustrating the structure of a white light-emitting semiconductor device 100 according to example 1. The white light-emitting semiconductor device 100 comprises an SMD-type package 101, a light-emitting semiconductor element 102 and a wavelength conversion part 103. The light-emitting semiconductor element 102 is a blue light-emitting element having an emission peak wavelength lying within the range from 430 to 470 nm, preferably from 440 to 460 nm. The wavelength conversion part 103 includes a wide-band red phosphor and a green phosphor (phosphors not illustrated in the figure) that emit light upon being excited by the light-emitting semiconductor element 102. The term "green phosphor" means a phosphor which emits light having a color that is classified as "GREEN" or "YELLOWISH GREEN" in the xy chromaticity diagram (CIE 1931) shown in FIG. 2. The term "red phosphor" in the invention means a phosphor which emits light having a color that is classified as "RED", "REDDISH ORANGE", or "ORANGE" in the xy chromaticity diagram (CIE 1931) shown in FIG. 2.

The light-emitting semiconductor element 102 is fixed to the bottom face of the cup 101A which is provided in the SMD-type package 101. The light-emitting semiconductor element 102 is connected to a wiring pattern (not shown) that is formed on the bottom face of the package 101, such that current can be supplied to the light-emitting semiconductor element 102 from a power source that is disposed outside the package 101. Blue light emitted by the light-emitting semiconductor element 102 upon application of forward current strikes the wavelength conversion part 103 that is disposed so as to plug the opening of the cup 101A, and part of the blue light is converted to green light and red light by a green phosphor and a wide-band red phosphor, respectively, that are contained in the wavelength conversion part 103. White light that results from mixing of blue light, green light and red light is emitted outwards through the surface of the wavelength conversion part 103.

The light-emitting semiconductor element 102 may be an LED element, a superluminescent diode element, a laser diode element or the like, preferably an LED element. The type of semiconductor that makes up the light-emitting part of the light-emitting semiconductor element 102 is not particularly limited. Examples thereof include, for instance, semiconductors such as gallium nitride-based semiconductors, zinc oxide-based semiconductors and silicon carbide-based semiconductors. Particularly preferred elements used as the light-emitting semiconductor element 102 include InGaN-based blue LED elements having a double heterostructure wherein an MQW active layer, having an InGaN well layer, is sandwiched between p type and n type GaN-based clad layers. In an example, a blue light-emitting element having an emission peak wavelength ranging from 440 to 460 nm is used as the light-emitting semiconductor element 102, in order to enhance color rendering. In addition, an LED element having an emission peak wavelength ranging from 470 to 500 nm may be disposed inside or outside the cup 101A.

The correlated color temperature of white light emitted by the white light-emitting semiconductor device 100 ranges ordinarily from 2500 to 7000 K. From the viewpoint of comfort in illumination, the Duv of this white light ranges ordinarily from −6.0 to +6.0, more preferably from −6.0 to +2.0, and particularly preferably from −6.0 to 0.0.

Known green phosphor including $Eu^{2+}$, $Ce^{3+}$, or the like as an activator can be advantageously used in the wavelength conversion unit 103. Suitable green phosphors employing $Eu^{2+}$ as an activator are green phosphors including crystals containing an alkaline earth silicate, alkaline earth silicate nitride, or Sialon as a base. These kind of green phosphor can usually be excited using an ultraviolet to blue light-emitting semiconductor element. Examples of the green phosphors employing crystals of an alkaline earth silicate as a base include $(Ba,Ca,Sr,Mg)_2SiO_4$:Eu and $(Ba,Sr,Ca)_2(Mg,Zn)Si_2O_7$:Eu. Examples of the green phosphers employing crystals of an alkaline earth silicate nitride as a base include $(Ba,Ca,Sr)_3Si_6O_{12}N_2$:Eu, $(Ba,Ca,Sr)_3Si_6O_9N_4$:Eu, and $(Ca,Sr,Ba)Si_2O_2N_2$:Eu. Examples of the green phosphors employing Sialon crystals as a base include β-Sialon:Eu, $Sr_3Si_{13}Al_3O_2N_{21}$:Eu, and $Sr_5Al_5Si_{21}O_2N_{35}$; Eu. The $Sr_3Si_{13}Al_3O_2N_{21}$:Eu is disclosed in International Publication No. 2007-105631, pamphlet (Patent Document 6), and the $Sr_5Al_5Si_{21}O_2N_{35}$:Eu is disclosed in International Publication No. 2009-072043, pamphlet (Patent Document 7). Suitable green phosphors employing $Ce^{3+}$ as an activator include green phosphors including crystals of a garnet-type oxide as a base, such as, for example, $Ca_3(Sc,Mg)_2Si_3O_{12}$:Ce, $(Y,Lu)_3(Al,Ga)_5O_{12}$:Ce and green phosphors including crystals of an alkaline earth metal scandate as a base, such as, for example, $CaSc_2O_4$:Ce.

A wide-band red phosphor used in the wavelength conversion unit 103 is a phosphor having a broad emission spectrum such as a red phosphor which has an emission band having a full width at half maximum of 80 nm or more, generally 120 nm or less. For example, red phosphors each employing $Eu^{2+}$ as an activator and crystals containing an alkaline earth silicate nitride, α-Sialon, or alkaline earth silicate as a base. These kind of red Phosphor can usually be excited using an ultraviolet to blue light-emitting semiconductor element. Examples of the red phosphors employing crystals of an alkaline earth siliconitride as a base include $(Ca,Sr,Ba)AlSiN_3$:Eu, $(CaAlSiN_3)_{1-x}(Si_{(3n+2)/4}N_nO)_x$:Eu, $(Ca,Sr,Ba)_2Si_5N_8$:Eu, and $SrAlSi_4N_7$:Eu. The $SrAlSi_4N_7$:Eu is a red phosphor disclosed in, for example, JP-A-2008-150549 (Patent Document 8). Examples of the red phosphors employing crystals of an alkaline earth silicate as a base include $(Sr,Ba)_3SiO_5$:Eu.

Herein, $(CaAlSiN_3)_{1-x}(Si_{(3n+2)/4}N_nO)_x$:Eu is an inorganic compound crystal wherein $Eu^{2+}$, as an emission center, is distributed within a crystal that is a solid solution of $CaAlSiN_3$ and $Si_{(3n+2)/4}N_nO$. By virtue of such base structure, the emission spectrum of the phosphor is broader than that of $CaAlSiN_3$:Eu, and the peak wavelength is shorter (shorter than 650 nm). Herein, $SrAlSi_4N_7$:Eu has emission characteristics similar to those of $Ca_{1-x}Al_{1-x}Si_{1+x}N_{3-x}O_x$:Eu. Also, $Ca_{1-x}Al_{1-x}Si_{1+x}N_{3-x}O_x$:Eu corresponds to a case where n=2 in $(CaAlSiN_3)_{1-x}(Si_{(3n+2)/4}N_nO)_x$:Eu.

The wavelength conversion part 103 may contain a phosphor other than the green phosphor and the wide-band red phosphor, to the extent that the effect of the invention is not impaired thereby. Such other phosphors may be a for instance, a yellow phosphor, a narrow-band red phosphor or the like.

Figure 2:
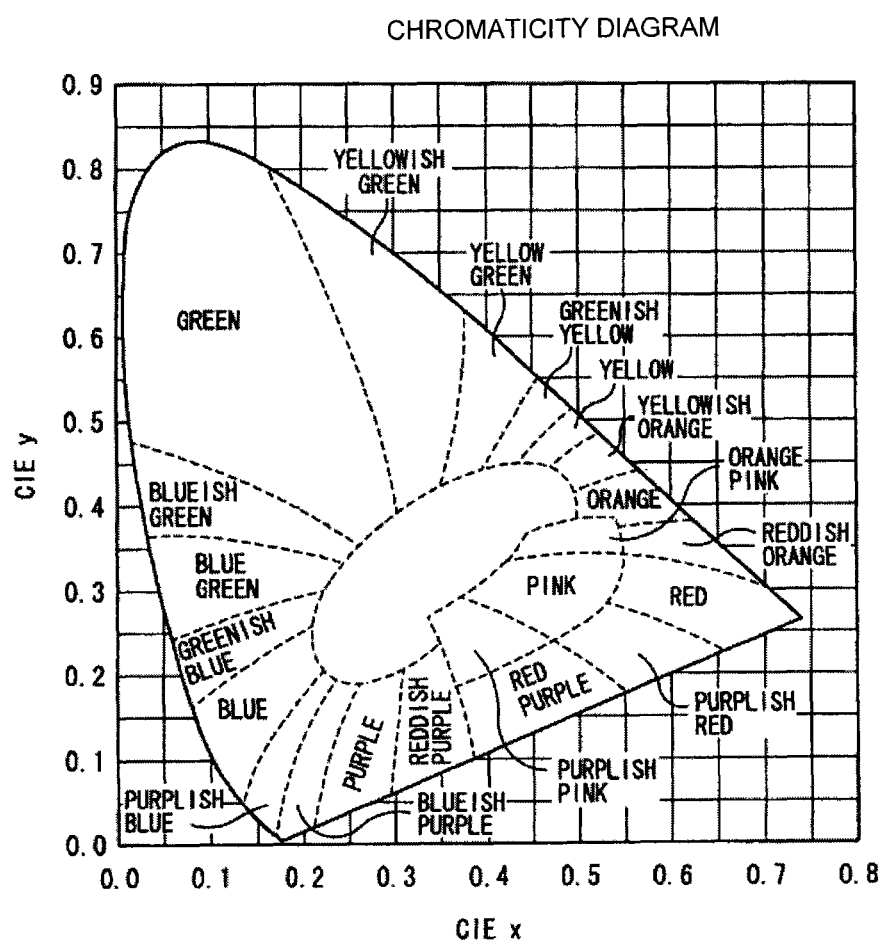
FIG. 2 is a chromaticity diagram (CIE 1931).

The term "yellow phosphor" means a phosphor which emits light having a color that is classified as "YELLOW GREEN", "GREENISH YELLOW", "YELLOW", or "YELLOWISH ORANGE" in the xy chromaticity diagram (CIE 1931) shown in FIG. 2. As representative examples of yellow phosphor include phosphors each employing $Ce^{3+}$ as an activator and crystals of a garnet-type oxide as a base, such as, for example, $(Y,Gd)_3Al_5O_12$:Ce and $Tb_3Al_5O_{12}$:Ce. Other examples of yellow phosphors include phosphors each composed of $Ce^{3+}$ as an activator and crystals of a lanthanum siliconitride as a base, such as, for example, $La_3Si_6N_{11}$:Ce and $Ca_{1.5}xLa_{3-x}Si_6N_{11}$:Ce.

Other yellow phosphors include alkaline earth silicate-based yellow phosphors referred to as BOSE (or BOS), having $Eu^{2+}$ as an activator.

Focusing now on the stability of the phosphor, phosphors the base crystal thereof comprises nitrogen, for instance alkaline earth siliconitride, Sialon and alkaline earth silicon oxynitride phosphors, exhibit excellent durability and heat resistance by virtue of the high degree of covalency among interatomic bonds in the base crystal. Among green phosphors, silicate-based $(Ba,Ca,Sr,Mg)_2SiO_4$:Eu exhibit very high luminous efficiency at room temperature, but significantly decreased luminous efficiency at high temperature, and hence are not appropriate for high-power applications. Phosphors the base thereof is a crystal of a compound containing sulfur are not recommended, regardless of the emission color. That is because small amounts of sulfur released from the base crystal may react with metals that are present in the light-emitting semiconductor element, or the package, encapsulating material and so forth, giving rise to coloring substances. The luminous efficiency of the white light-emitting device becomes significantly impaired as a result, since such coloring substances absorb visible light.

A resin or glass that is transparent in the visible wavelength region can be used as the matrix material that holds the phosphor in the wavelength conversion part 103. Examples of resins include, for instance, various types of thermoplastic resins, thermosetting resins and photocurable resins, specific examples whereof include, for instance, methacrylic resins (polymethyl methacrylate or the like), styrene resins (polystyrene, styrene-acrylonitrile copolymers and the like), polycarbonate resins, polyester resins, phenoxy resins, butyral resins, polyvinyl alcohol, cellulose resins (ethyl cellulose, cellulose acetate, cellulose acetate butyrate and the like), epoxy resins phenolic resins, and silicone resins. Preferred examples of glass include, for instance, known low-melting point glass types such as phosphate glass, borophosphate glass, vanadium borate glass, alkali silicate glass, bismuth glass or the like.

From the viewpoint of heat resistance and light resistance, a silicon-containing compound is preferred as the matrix material of the wavelength conversion part 103. Herein, the term silicon-containing compound denotes a compound having a silicon atom in the molecule. Examples thereof include, for instance, organic materials (silicone-based materials) such as polyorganosiloxanes, inorganic materials such as silicon oxide, silicon nitride, silicon oxynitride and the like, and glass materials such as borosilicate glass, phosphosilicate glass and alkaline silicate glass. Particularly preferred among the foregoing are silicone-based materials, from the viewpoint of transparency, adhesiveness, ease of handling, and excellent mechanical-thermal stress relaxation characteristics, among other properties. Silicone-based materials ordinarily refer to organic polymers having siloxane bonds in the main chain. Depending on the curing mechanism, such materials may be, for instance, of condensation type, addition type, sol-gel type or photocurable type.

Besides phosphor microparticles, for instance a light-scattering agent may also be dispersed in the wavelength conversion part 103. The matrix material itself in the wavelength conversion part 103 may be a composite material wherein nano-scale microparticles, the purpose thereof is to adjust various properties such as optical characteristics, mechanical characteristics, heat resistance and so forth, are dispersed in a resin or glass.

The form in which the phosphor is incorporated in the wavelength conversion part 103 is arbitrary. For instance, the phosphor distribution in the interior of the wavelength conversion part 103 may be uniform or non-uniform. Also, the interior of the wavelength conversion part 103 may have portions at which only a specific phosphor is present, or portions at which only a specific phosphor is absent. Various structures may be appropriately used herein, for instance a multilayer structure in which layers containing a green phosphor alone and layers containing a red phosphor alone are stacked directly or indirectly on each other, or a multilayer structure in which layers of dissimilar matrix materials are stacked on each other. The wavelength conversion part 103 may be a thin layer formed on the surface of a transparent supporting film.

A space S between the light-emitting semiconductor element 102 and the wavelength conversion part 103 in the white light-emitting semiconductor device 100 may be void, or part or the entirety of the space S may be filled with a light-transmitting material, for instance the materials exemplified as the matrix material of the wavelength conversion part 103. The space S need not necessarily be provided. In an example, the wavelength conversion part 103 may be disposed so as to be in contact with the light-emitting semiconductor element 102 inside the cup 101A. The wavelength conversion part 103 may be a thin layer that covers conformally the surface of the light-emitting semiconductor element 102.

[2] Example 2

The white light-emitting semiconductor device according to example 2 differs significantly from the white light-emitting semiconductor device of example 1 as regards two features. Firstly, a purple light-emitting element having a emission peak wavelength ranging from 400 to 430 nm, or an ultraviolet light-emitting element having an emission peak wavelength shorter than 400 nm (ordinarily, 360 nm or longer) is used instead of the blue light-emitting element, as the light-emitting semiconductor element. Secondly, the wavelength conversion part includes a blue phosphor.

The term "blue phosphor" means a phosphor which emits light having a color that is classified as "PURPULISH BLUE", "BLUE", or "GREENISH BLUE" in the xy chromaticity diagram (CIE 1931) shown in FIG. 2.

The light-emitting semiconductor element used in the white light-emitting semiconductor device according to the example 2 is preferably a purple light-emitting element, on account of the smaller Stokes shift loss of such an element. Purple light-emitting semiconductor elements of highest efficiency currently available are InGaN-based purple LED elements. As is known, InGaN-based LED elements having an active layer in the form of an InGaN layer boast maximal luminous efficiency when the emission peak wavelength ranges from 410 to 430 nm (Non-Patent Document 1). By contrast, the excitation efficiency of high-efficiency blue phosphors is ordinarily high in the ultraviolet to near ultraviolet region, but drops steeply with increasing wavelength at wavelengths longer than 405 nm. Taking into account as well the excitation characteristics of such blue phosphors, it is found that the purple LED element that is most suitable for the white light-emitting semiconductor device of example 2 is an InGaN-based LED element that has an emission peak wavelength ranging from 400 to 420 nm, in particular from 405 to 415 nm.

The kind of blue phosphors which can be used in a white light-emitting semiconductor device of example 2 include blue phosphors each composed of $Eu^{2+}$ as an activator and crystals containing an alkaline earth aluminate or alkaline earth halophosphate as a base, such as, for example, $(Ba,Sr,Ca)MgAl_{10}O_{17}$:Eu and $(Ca,Sr,Ba)_5(PO_4)_3Cl$:Eu. Preferred of these are $BaMgAl_{10}O_{17}$:Eu and $Sr_{5-x}Ba_x(PO_4)_3Cl$:Eu ($0<x<5$), which have high emission efficiency and a relatively broad emission band such as an emission band having a full width at half maximum of 50 nm or more.

In example 2, preferably, there is used no phosphor (ordinarily, green or yellow phosphor) having $Ce^{3+}$ as an activator. That is because many of such phosphors have an excitation spectrum peak around 450 nm wavelength, and hence exhibit strong absorption of the light emitted by the blue phosphor that is used concurrently. Such multi-step excitation in which a phosphor excites another phosphor (also referred to as cascade excitation) results in a significant drop in the efficiency of the white light-emitting semiconductor device. The emission wavelength of the light-emitting semiconductor element in example 2 is shorter than that of example 1. Therefore, higher light resistance is required from the matrix material of the wavelength conversion part.

[3] Requirement (A)

The white light-emitting semiconductor devices of both example 1 and example 2 exhibit a good special color rendering index R9 value, of about 85 or more, when the requirement (A) below relating to the emission spectrum of the white light-emitting semiconductor device (spectrum of white light emitted by the white light-emitting semiconductor device towards the exterior) is satisfied:

(A) The intensity at wavelength 640 nm of the emission spectrum which has been normalized with respect to luminous flux is 100-110% of the intensity at wavelength 640 nm of a spectrum of standard light for color rendering evaluation which has been normalized with respect to luminous flux.

The term "standard light for color rendering evaluation" used in the requirement (A) means standard light as provided for in Japan Industrial Standards JIS Z8726:1990, which prescribes for a method for evaluating the color rendering properties of light sources. When a white light-emitting semiconductor device as a sample light source has a correlated color temperature lower than 5,000 K, then the standard light is light from a full radiator. And, when a white light-emitting semiconductor device has a correlated color temperature of 5,000 K or higher, the standard light is CIE daylight. The definition of full radiator and CIE daylight is in accordance with JIS Z8720:2000 (corresponding international standard, ISO/CIE 10526:1991).

The term "spectrum of light which has been normalized with respect to luminous flux" used in the requirement (A) means a spectrum (spectral radiant flux Φe in the following mathematical expression (1)) which has been normalized so that the luminous flux Φ determined by the following mathematical expression (1) is 1 (unity).

$$\Phi = Km \int_{380}^{780} V_\lambda \Phi_e d\lambda \qquad (1)$$

In mathematical expression (1),
Φ is luminous flux [lm],
Km is maximum spectral luminous efficiency [lm/W], Vλ is special luminous efficiency function for photopic vision, Φe is special radiant flux [W/nm], and λ is wavelength [nm].

In the following explanations, the proportion of the intensity ($I_{580-1}$) at wavelength 580 nm of the spectrum of light outputted by a white light-emitting semiconductor device (sample luminous source) which has been normalized with respect to luminous flux to the intensity ($I_{580-2}$) at wavelength 580 nm of the spectrum of standard light for color rendering evaluation which has been normalized with respect to luminous flux ($I_{580-1}/I_{580-2}$) is often called "580-nm intensity ratio". Also, the proportion of the intensity ($I_{640-1}$) at wavelength 640 nm of the spectrum of light outputted by a white light-emitting semiconductor device (sample luminous source) which has been normalized with respect to luminous flux to the intensity ($I_{640-2}$) at wavelength 640 nm of the spectrum of standard light for color rendering evaluation which has been normalized with respect to luminous flux ($I_{640-1}/I_{640-2}$) is often called "640-nm intensity ratio". The requirement (A) represents the 640-nm intensity ratio falls within a range of 100%-110%.

In the white light-emitting semiconductor device of example 1 or example 2, preferably, a wide-band red phosphor having a emission peak wavelength ranging from 641 nm to 648 nm is used in the wavelength conversion part, in order to satisfy the above requirement (A). A wide-band red phosphor having an emission peak wavelength of 640 nm or shorter is preferably used together with a wide-band red phosphor having an emission peak wavelength of 649 nm or longer. As used herein, the term emission peak wavelength of the phosphor denotes the value for which the phosphor is excited by light of a wavelength close to the emission peak wavelength $\lambda_E$ of the light-emitting semiconductor element that is used as the excitation source in the white light-emitting semiconductor device (preferably of a wavelength lying within the range $\lambda_E \pm 10$ nm).

The 640-nm intensity ratio of the white light-emitting semiconductor devices of example 1 and example 2 tends to decrease as the 580-nm intensity ratio of the white light-emitting semiconductor device increases. Therefore, the 640-nm intensity ratio can be controlled by adjusting the 580-nm intensity ratio. Preferably, the 580-nm intensity ratio is set to range from 85 to 100% in order to satisfy requirement (A).

Appropriate selection of the green phosphor and the wide-band red phosphor that are used in the wavelength conversion part is important in order to bring the 580-nm intensity ratio to 85 to 100%. For convenience in the explanation, the intensity at the wavelength 580 nm in the phosphor emission spectra, expressed as a relative value with respect to 1, which is the intensity at the emission peak wavelength (emission peak intensity), is defined as the "580-nm relative intensity" of the phosphor. In the case of the green phosphor and the red phosphor, the 580-nm relative intensity increases the closer the emission peak wavelength is to 580 nm, and the greater the full width at half maximum of the emission peak is. The 580-nm intensity ratio of the white light-emitting semiconductor device increases when using a green phosphor and a red phosphor both of which have high 580-nm relative intensity. Conversely, the 580-nm intensity ratio of the white light-emitting semiconductor device decreases when using a green phosphor and a red phosphor both of which have low 580-nm relative intensity. Using a yellow phosphor has the effect of increasing the 580-nm intensity ratio of the white light-emitting semiconductor device. That is because the yellow phosphor has a significant presence of components around the wavelength 580 nm in the emission spectrum, and has therefore a higher 580-nm relative intensity than the green phosphor and the red phosphor.

In one method, the 580-nm intensity ratio of the white light-emitting semiconductor device can be adjusted to lie within a preferred range by using a combination of a plurality of wide-band red phosphors having dissimilar 580-nm relative intensities. Thereby, the 640-nm intensity ratio can be accordingly controlled so as to lie within a range from 100 to 110%. In other methods, the above range can be achieved by using a combination of a plurality of green phosphors having dissimilar 580-nm relative intensities, or by using a combination of a green phosphor and a yellow phosphor.

Findings by the inventors, arrived at through prototype testing, have revealed that an R9 of 90 or more can be achieved in a white LED having the correlated color temperature of 6700 K, even if requirement (A) is not satisfied. Therefore, it is found that requirement (A) is a sufficient condition, but not a necessary and sufficient condition, for achieving a high R9, at least in a white light-emitting semiconductor device having the correlated color temperature of 6700 K.

[4] Example 3

An example is explained next in which the present invention is used in a light-emitting module for tunable illumination.

Figure 3:
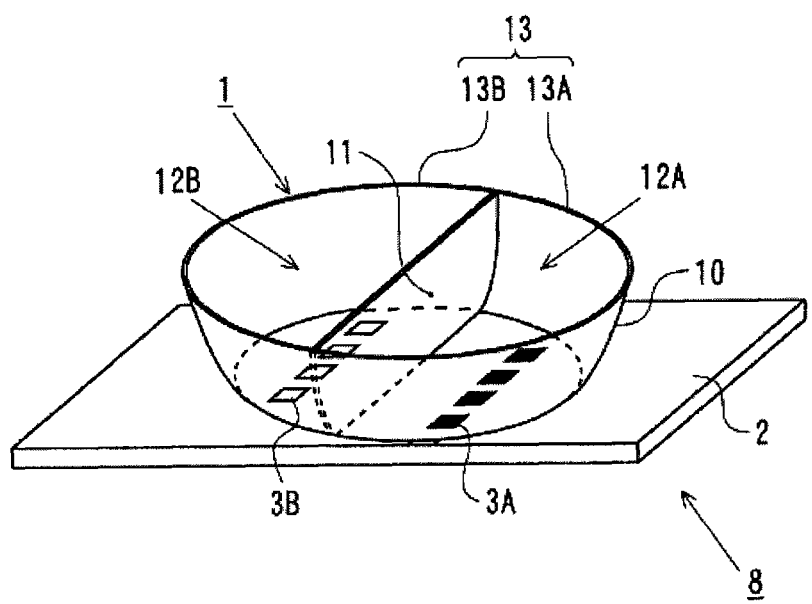
FIG. 3 is a perspective-view diagram of a white LED.
Figure 4:
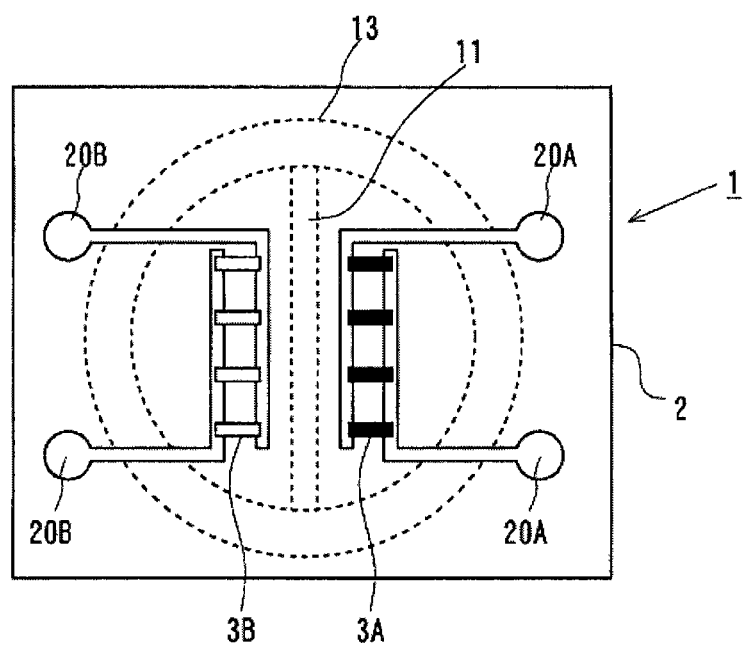
FIG. 4 is a plan-view diagram illustrating the way in which a LED chip is connected in the white LED depicted FIG. 3.
Figure 5:
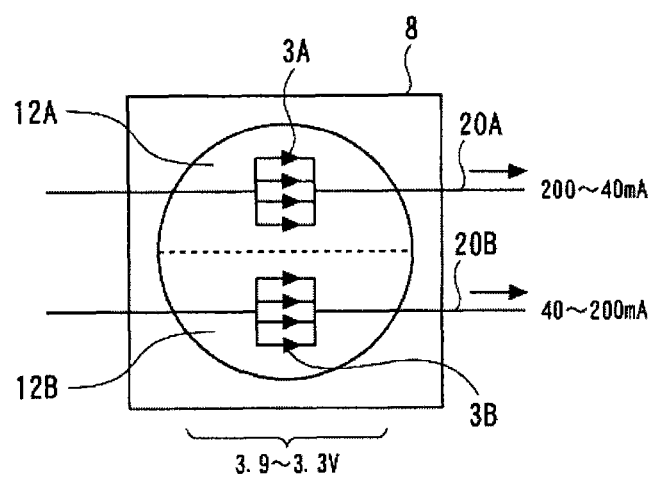
FIG. 5 is a diagram illustrating a circuit configuration of the white LED depicted in FIG. 3 and FIG. 4.
Figure 6:
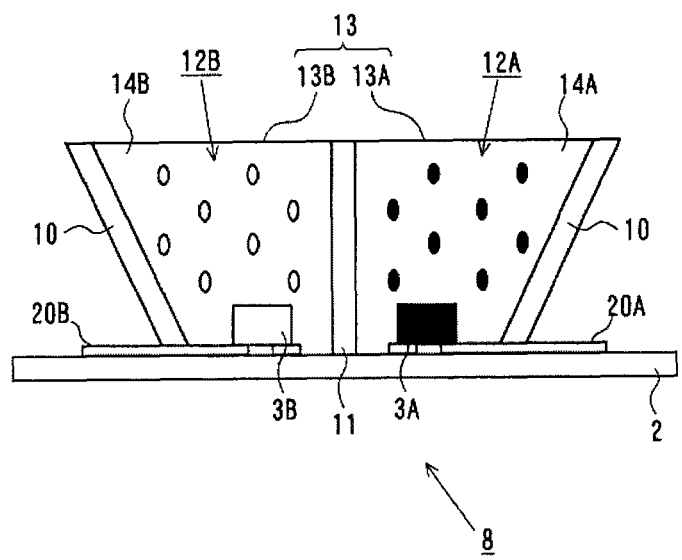
FIG. 6 is a cross-sectional diagram of the white LED illustrated in FIG. 3 and FIG. 4.

FIG. 3 is a perspective-view diagram of a white LED 8 that is mounted on a light-emitting module 30 for illumination (see FIG. 7 described below). FIG. 4 is a plan-view diagram illustrating the way in which LED chips 3A, 3B are connected to lead electrodes 20A, 20B in the white LED 8 illustrated in FIG. 3. FIG. 5 is a diagram illustrating a circuit configuration of the white LED 8 illustrated in FIG. 3 and FIG. 4. FIG. 6 is a cross-sectional diagram of the white LED 8 illustrated in FIG. 3 and FIG. 4, cut along a plane that includes the lead electrodes 20A, 20B.

As shown in FIG. 3, the white LED 8 comprises a package 1 that has two cups. The package 1 has an insulating substrate 2, lead electrodes 20A, 20B (not shown in FIG. 3) patterned on the surface of the insulating substrate 2, a ring-like frame 10 joined to the top of the insulating substrate 2, and a partition 11 that separates a first cup 12A and a second cup 12B. The insulating substrate 2 is, for instance, an alumina substrate, a metal base substrate, a glass-epoxy substrate or the like. The lead electrodes 20A, 20B are formed using conductor pattern formation techniques for printed boards.

At least the surface of the frame 10 and of the partition 11 have formed thereon a material having high reflectance in the visible wavelength region, in such a way so as not to preclude passage of light that is emitted by the LED chips 3A, 3B, and of light generated by below-described fluorescent parts 14A, 14B. Examples of such a material include, for instance, white ceramics such as alumina or the like, white resins (resins rendered white through addition of a white pigment), as well as silvery-white metals (including alloys) such as Ag, Al, Pt, Rh, Ni or the like. The frame 10 and the partition 11 are fixed to the insulating substrate 2 using an adhesive agent. The frame 10 and the partition 11 may be formed integrally with each other.

Four LED chips 3A, 3B are mounted in each of the first cup 12A and the second cup 12B. The four LED chips in each cup are of the same type, and are connected in parallel by the lead electrodes, as illustrated in FIG. 4. The LED chips 3A, 3B emit light upon being supplied power through the lead electrodes 20A, 20B, respectively. The LED chips 3A, 3B are InGaN-based LED chips that emit blue light. The fluorescent parts 14A, 14B are provided in the first cup 12A and the second cup 12B, respectively, in such a way so as to be covered by the LED chips 3A, 3B, as illustrated in FIG. 6. The fluorescent parts 14A, 14B include a phosphor that emits light upon absorption of light generated by the LED chips 3A, 3B, respectively. The fluorescent parts 14A, 14B are formed by a composition that results from dispersing a phosphor in a light-transmitting material that is appropriate for encapsulation and protection of LED chips, for instance a silicone resin, an epoxy resin or low-melting point glass.

The LED chip 3A and the fluorescent part 14A in the first cup 12A make up a white light-emitting unit ("white light-emitting unit A") that generates white light having a correlated color temperature $Tcp_1$. The LED chip 3B and the fluorescent part 14B in the second cup 12B make up another white light-emitting unit ("white light-emitting unit B") that generates white light having a correlated color temperature $Tcp_2$. Upon simultaneous lighting of the white light-emitting unit A and the white light-emitting unit B, the white LED 8 emits white combined light (secondary white light) being a mixture of while light (primary white light) generated by each white light-emitting unit. The correlated color temperature of the combined light can be made to vary between $Tcp_1$ and $Tcp_2$ through adjustment of the ratio of power that is supplied to the white light-emitting unit A and the white light-emitting unit B. As used herein, the term "simultaneous lighting" denotes lighting that is perceived as simultaneous by human vision.

In indoor illumination, the range over which the correlated color temperature of illumination light can vary is preferably set to 2000 K or greater, to enable sufficient color tuning for modifying the atmosphere inside a room. For the above reason, the difference between $Tcp_1$ and $Tcp_2$ is set to be 2000 K or greater. For instance, $Tcp_1$ is set so as to range from 2500 K to 3500 K, and $Tcp_2$ so as to range from 4500 K to 7000 K.

Preferably, the average color rendering index (CRI; Ra) of both the white light-emitting unit A and the white light-emitting unit B is 80 or greater. Further, the average color rendering index is preferably 90 or greater in both units, in applications where high color rendering is required, for instance in art-gallery illumination. The inventors found experimentally that if Ra is 80 or greater for both white light-emitting units, the white LED 8 has ordinarily a Ra of 80 or greater, for any correlated color temperature within the variation range thereof.

Both the white light-emitting unit A and the white light-emitting unit B satisfy the above-described requirement (A). Accordingly, the white LED 8 satisfies requirement (A), regardless of the ratio of the primary white light of the respective white light-emitting units in the combined light emitted by the white LED 8. In other words, the special color rendering index R9 of the white LED 8 has a good value even when the correlated color temperature of the combined light that is emitted takes on any value lying within the range from $Tcp_1$ to $Tcp_2$.

Figure 7:
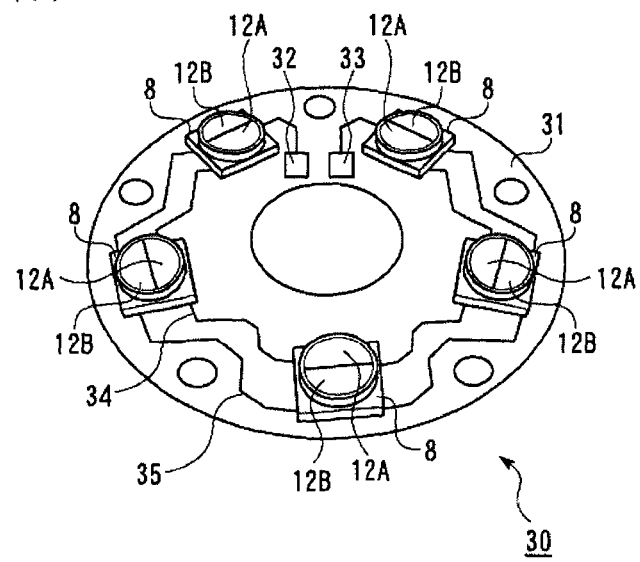
Figure 7:
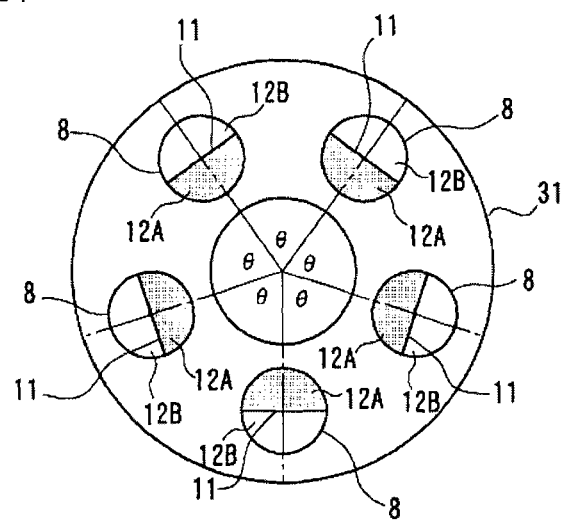
Figure 8:
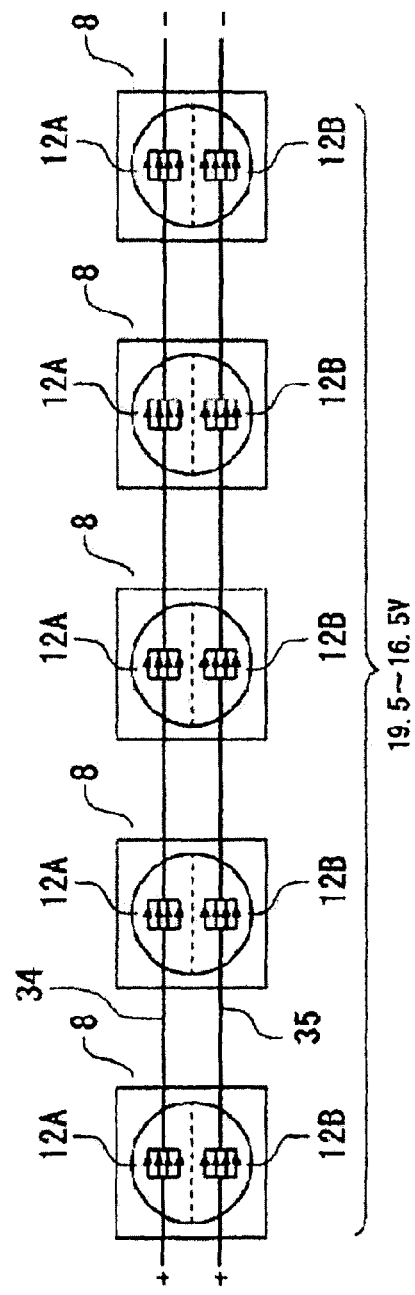
FIG. 8 is a diagram illustrating a circuit configuration of the light-emitting module illustrated in FIG. 7.

FIG. 7 is a diagram illustrating a configuration example of a light-emitting module in which a plurality of white LEDs 8 is mounted. FIG. 7(a) is a perspective-view diagram of a light-emitting module; and FIG. 7(b) is a plan-view diagram illustrating schematically the arrangement state of five white LEDs on the light-emitting module illustrated in FIG. 7(a). As illustrated in FIG. 7(b), the five white LEDs 8 are disposed at equal angles on a circumference that is centered on the center point of a disc-like circuit board 31. In the light-emitting module 30, LED chip groups (each comprising four LED chips 3A connected in parallel) in the first cups 12A of respective white LEDs 8 are wired in series by way of a wiring layer 34, and LED chip groups (each comprising four LED chips 3B connected in parallel) in the second cups 12B of respective white LEDs 8 are wired in series by way of a wiring layer 35. FIG. 8 illustrates such a circuit configuration. Wiring thus in series LED chip groups of each type allows varying separately the current that is applied to the white light-emitting unit A and the current that is applied to the white light-emitting unit B.

Figure 9:
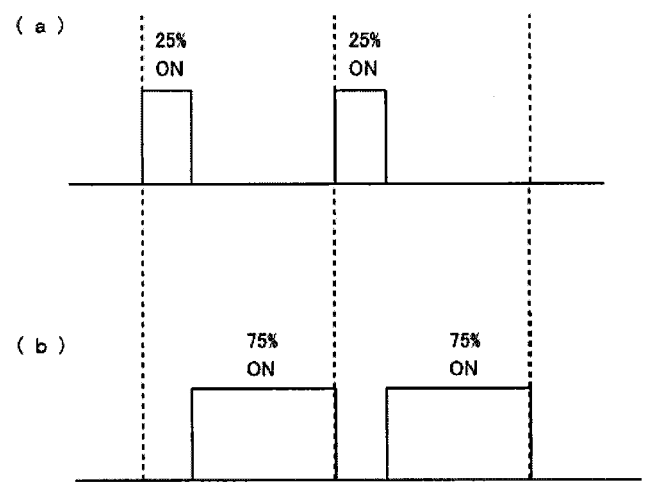
FIG. 9 is a diagram illustrating an example of a current application pattern to the white LEDs mounted in the light-emitting module illustrated in FIG. 7.

FIG. 9 is a diagram illustrating an example of a current application pattern in the light-emitting module 30, wherein FIG. 9(a) illustrates the relationship between time and current supplied to the LED chips 3A that are disposed in the first cup 12A of each white LED 8, and FIG. 9(b) illustrates the relationship between time and current supplied to the LED chip 3B disposed in the second cup 12B of each white LED 8. In a case where a square-waveform current is applied to each LED chip 3, as in this example, the ratio between light intensity emitted per unit time by the white light-emitting unit A and by the white light-emitting unit B can be modified by modifying the ratio of the time over which current is applied to the LED chips 3A and the time over which current is applied to the LED chips 3B. The color temperature of the output light of the light-emitting module 30 can be easily controlled thereby.

In order for the light-emitting module 30 to satisfy requirement (A), preferably, all the white LEDs 8 mounted in the light-emitting module 30 satisfy the above-described requirement (A). However, the light-emitting module 30 may in some cases satisfy requirement (A) even if some or all of the white LEDs 8 fail to satisfy requirement (A).

In the light-emitting module 30A, a white LED (white light-emitting unit A) having a correlated color temperature $Tcp_1$ and a white LED (white light-emitting unit B) having a correlated color temperature $Tcp_2$, each unit being formed using a respective ordinary one-cup package, may be used, can be disposed on the disc-like circuit board 31, instead of using a white LED 8 in which the white light-emitting unit A and the white light-emitting unit B are integrated together using the two-cup package 1 illustrated in FIG. 3A. Alternatively, a chip-on-board configuration may be resorted to in which no package is used and the wiring layer of the circuit board 31 is formed to a pattern that is appropriate for mounting of LED chips, the LED chips being mounted directly on the circuit board 31.

Figure 10:
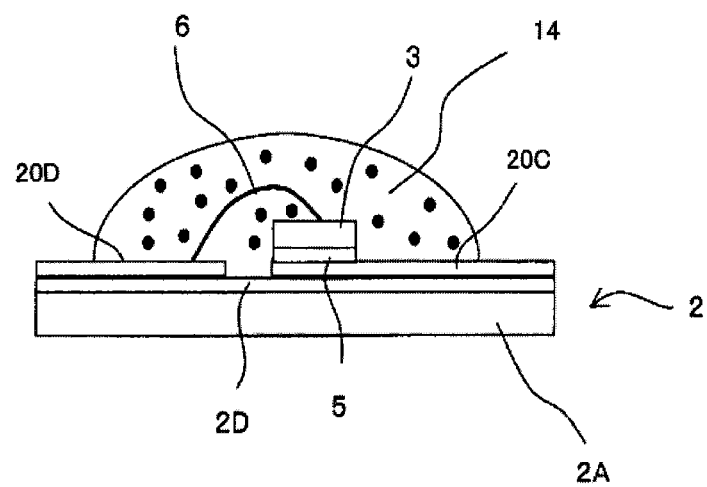
FIG. 10 is a cross-sectional diagram illustrating a configuration example of a white light-emitting unit.

FIG. 10 is a cross-sectional diagram illustrating a configuration example of a white light-emitting unit that utilizes no cup. The LED chips 3 mounted on the insulating substrate 2 (which has the metal substrate 2A, lead electrodes 20C, 20D and an insulating layer 2D), are covered by a dome-like molded fluorescent part 14. The LED chip 3 and the wiring layer 20C are connected by solder or a conductive adhesive agent 5 such as a silver paste or the like. The LED chip 3 and the wiring layer 20D are connected by a gold wire 6.

[5] Other Embodiments

The white light-emitting semiconductor device according to the embodiments of the present invention may be provided with various other optical elements such as lenses, optical fibers, waveguides, reflective mirrors, filters and so forth. Such optical elements may be disposed between the light-emitting semiconductor element and the phosphors, or may be disposed on the along the path followed by light emitted by the light-emitting semiconductor element or by the phosphor up to the site at which the light is emitted out of the light-emitting device. The white light-emitting semiconductor device according to the embodiments of the present invention may be provided with a power source, a control circuit and so forth.

The white light-emitting semiconductor device according to the embodiments of the present invention encompasses also an illumination device into which a white light-emitting unit, a white LED or a white light-emitting module is assembled. Such an illumination device may have a filter element that is disposed on the path traveled by the light that is emitted by the white light-emitting unit, the white LED or the white light-emitting module, up to the site at which the light is emitted out of the illumination device. The shape of the emission spectrum of the illumination device is controlled thus by way of the filter element, so that requirement (A) can be satisfied as a result.

[6] Results of Experiments

The results of experiments (including simulations) made by the present inventors are described below. The finding of the requirement (A) was obtained through the experiments. Table 1 is a list of the phosphors used in the experiments.

based on the results of an examination of an emission spectrum of a red light-emitting unit. This red light-emitting unit was produced by mounting one InGaN-based light-emitting diode chip having an emission peak wavelength of 402 nm in a 3528 SMD type PPA resin package and encapsulating the package with a silicone resin composition to which powdery SBS had been added. The light-emitting diode chip had a size of 350 μm square, and the current which was applied to the red light-emitting unit during emission spectrum examination was 20 mA.

As shown in Table 1, red phosphors used in the examples are all wide-band phosphor having a full width at half maximum of 80 nm or more. Of these, SCASN-1 and SCASN-2, which each are a red phosphor represented by the same general formula $Sr_xCa_{1-x}AlSiN_3$:Eu, differ in emission characteristics. CASON-1 and CASON-2, which each are a red phosphor represented by the same general formula $Ca_{1-x}Al_{1-x}Si_{1+x}N_{3-x}O_x$:Eu, differ in emission characteristics. The base of $Ca_{1-x}Al_{1-x}Si_{1+x}N_{3-x}O_x$:Eu is a solid solution between $CaAlSiN_3$ and $Si_2N_2O$, and is sometimes expressed by $(CaAlSiN_3)_{1-x}(Si_2N_2O)_x$.

TABLE 1

| Name | Classification | General formula | Emission peak wavelength [nm] (excitation wavelength [nm]) | Full width at half maximum [nm] | Relative intensity at 580 nm |
|---|---|---|---|---|---|
| BAM | Blue phosphor | $BaMgAl_{10}O_{17}$:Eu | 455 (400) | 52 | — |
| SCA | Blue phosphor | $Sr_5(PO_4)_3Cl$:Eu | 450 (405) | 28 | — |
| SBCA | Blue phosphor | $Sr_{5-x}Ba_x(PO_4)_3Cl$:Eu | 453 (410) | 62 | — |
| BSS | Green phosphor | $(Ba,Ca,Sr,Mg)_2SiO_4$:Eu | 529 (405) | 66 | 0.32 |
|  |  |  | 529 (450) | 67 | 0.33 |
| BSON | Green phosphor | $(Ba,Ca,Sr)_3Si_6O_{12}N_2$:Eu | 535 (405) | 71 | 0.45 |
| β-SiAlON | Green phosphor | $Si_{6-z}Al_zN_{8-z}O_z$:Eu | 542 (400) | 56 | 0.41 |
| CSMS | Green phosphor | $Ca_3(Sc,Mg)_2Si_3O_{12}$:Ce | 516 (455) | 107 | 0.69 |
| CSO | Green phosphor | $CaSc_2O_4$:Ce | 520 (455) | 101 | 0.65 |
| YAG | Yellow phosphor | $Y_3Al_5O_{12}$:Ce | 559 (465) | 113 | 0.93 |
| SBS | Red phosphor | $(Sr,Ba)_3SiO_5$:Eu | 592 (402) | 84 | 0.92 |
|  |  |  | 596 (455) | 80 | 0.88 |
| SCASN-1 | Red phosphor | $Sr_xCa_{1-x}AlSiN_3$:Eu | 626 (405) | 88 | 0.35 |
|  |  |  | 628 (450) | 87 | 0.31 |
| SCASN-2 | Red phosphor | $Sr_xCa_{1-x}AlSiN_3$:Eu | 617 (455) | 81 | 0.48 |
| CASON-1 | Red phosphor | $Ca_{1-x}Al_{1-x}Si_{1+x}N_{3-x}O_x$:Eu | 643 (405) | 116 | 0.46 |
|  |  |  | 643 (450) | 106 | 0.35 |
| CASON-2 | Red phosphor | $Ca_{1-x}Al_{1-x}Si_{1+x}N_{3-x}O_x$:Eu | 638 (400) | 127 | 0.57 |
|  |  |  | 641 (450) | 111 | 0.43 |
| CASN-1 | Red phosphor | $CaAlSiN_3$:Eu | 659 (400) | 90 | 0.05 |
| CASN-2 | Red phosphor | $CaAlSiN_3$:Eu | 648 (455) | 88 | 0.13 |

Table 1 sets forth the names used in the present description, a classification based on emission color, and the formulas of various phosphors, as well as emission characteristics, namely peak wavelength (emission peak wavelength), full width at half maximum, and 580-nm relative intensity of the emission spectrum, of the various phosphors. All the values given as emission characteristics are values upon excitation at the wavelength given in parentheses in the column of emission peak wavelength. As described above, the 580-nm relative intensity is a value that represents, on a relative basis, the intensity at wavelength 580 nm of the emission spectrum with respect to 1 as the intensity at the emission peak wavelength in the emission spectrum (emission peak intensity).

Emission spectra of the phosphors were examined by an ordinary method in use in this field. However, the properties of the emission spectrum of SBS at an excitation wavelength of 402 nm was exceptionally, so that these properties are CASN-1 and CASN-2, which each are a red phosphor represented by the same general formula $CaAlSiN_3$:Eu, differ in emission characteristics. The fact that phosphors represented by the same general formula show different emission characteristics by the influence of a factor, such as, for example, activator concentration, impurity concentration, difference of base composition, or difference of base composition from the general formula, and that phosphors having various emission characteristics according to requests from the market are being produced while utilizing that fact are well known in this technical field.

Lists of white LED samples produced using the phosphors given in Table 1 are shown in Table 2 and Table 3. In the fifteen kinds of samples ranging from V-1 to V-15 shown in Table 2, a purple light-emitting diode element having an emission peak wavelength of about 405 nm is used as an excitation source for the phosphors. On the other hand, in the twelve kinds of samples ranging from B-1 to B-12 shown in Table 3, a blue light-emitting diode element having an emission peak wavelength of about 450 nm is used as a source of blue light and as an excitation source for the phosphors.

was 350 μm square in a 3528 SMD type PPA resin package and encapsulating the package with a silicone resin composition to which powdery phosphors had been added. Table 2 and Table 3 show the names of the phosphors used in each

TABLE 2

| Sample name | LED element | Phosphor name | | | Phosphor proportions [wt %] | | |
|---|---|---|---|---|---|---|---|
| | | Blue | Green | Red | Blue | Green | Red |
| V-1 | Purple | BAM | BSS | CASON-1 | 9.0 | 1.2 | 4.3 |
| V-2 | Purple | BAM | BSS | CASON-2 | 8.8 | 1.2 | 4.6 |
| V-3 | Purple | BAM | BSS | CASON-2, CASN-1 | 9.0 | 1.2 | 4.0 (CASON-2), 0.2 (CASN-1) |
| V-4 | Purple | BAM | BSS | CASON-2, CASN-1 | 9.0 | 1.4 | 3.8 (CASON-2), 0.4 (CASN-1) |
| V-5 | Purple | BAM | BSS | SBS | 8.2 | 0.8 | 7.0 |
| V-6 | Purple | BAM | BSS | SCASN-1 | 15.4 | 2.0 | 1.7 |
| V-7 | Purple | BAM | BSS | CASN-1 | 12.1 | 2.6 | 1.4 |
| V-8 | Purple | SCA | BSS | CASON-1 | 6.6 | 2.6 | 5.4 |
| V-9 | Purple | SCA | BSS | CASON-2 | 6.6 | 2.4 | 5.6 |
| V-10 | Purple | SBCA | β-SiAlON | CASON-1 | 3.5 | 2.2 | 4.8 |
| V-11 | Purple | SBCA | BSON | CASON-1 | 3.5 | 1.7 | 4.7 |
| V-12 | Purple | BAM | BSS | CASON-1 | 13.3 | 1.0 | 1.9 |
| V-13 | Purple | BAM | β-SiAlON | CASON-1 | 12.5 | 1.7 | 1.5 |
| V-14 | Purple | SBCA | β-SiAlON | CASON-1 | 4.6 | 1.7 | 2.3 |
| V-15 | Purple | SBCA | BSON | CASON-1 | 4.4 | 1.3 | 2.3 |

TABLE 3

| Sample name | LED element | Phosphor name | | | Phosphor proportions [wt %] | | |
|---|---|---|---|---|---|---|---|
| | | Blue | yellow | Red | Blue | yellow | Red |
| B-1 | Blue | BSS | — | CASON-1 | 6.5 | — | 6.8 |
| B-2 | Blue | BSS | — | CASON-2 | 6.5 | — | 8.0 |
| B-3 | Blue | CSMS | — | SCASN-1 | 7.9 | — | 2.1 |
| B-4 | Blue | CSO | — | SCASN-1 | 7.9 | — | 2.1 |
| B-5 | Blue | — | YAG | CASN-2 | — | 8.4 | 3.3 |
| B-6 | Blue | CSMS | — | CASN-2 | 10.4 | — | 4.1 |
| B-7 | Blue | CSMS | YAG | CASN-2 | 5.2 | 4.2 | 3.7 |
| B-8 | Blue | CSMS | YAG | CASN-2 | 9.3 | 1.1 | 3.9 |
| B-9 | Blue | — | YAG | SCASN-2 | — | 7.7 | 2.4 |
| B-10 | Blue | BSS | — | CASON-2 | 5.4 | — | 4.0 |
| B-11 | Blue | CSO | — | SCASN-1 | 5.9 | — | 0.8 |
| B-12 | Blue | — | YAG | — | — | 6.9 | — |

All white LED samples each were produced by mounting one InGaN-based light-emitting diode element (chip) which sample and the proportion (concentration) of each phosphor in the silicone resin composition used for encapsulating the light-emitting diode element. For example, sample V-1 has a structure obtained by encapsulating the purple light-emitting diode element with a silicone resin composition containing blue phosphor BAM, green phosphor BSS, and red phosphor CASON-1 in concentrations of 9.0 wt %, 1.2 wt %, and 4.3 wt %, respectively.

In Table 4 and Table 5 are shown the emission characteristics of each of white LED samples V-1 to V-15 and B-1 to B-12. The values of correlated color temperature, Duv, Ra, R9, maximum wavelength in red spectral region, 580-nm intensity ratio, and 640-nm intensity ratio each are based on the emission spectrum obtained when a current of 20 mA was applied to one white LED sample to cause the sample to emit light.

TABLE 4

| Sample name | LED element | Phosphor type | | | Correlated color temperature [K] | Duv | Ra | R9 | Maximum wavelength in red spectral region [nm] | 580-nm intensity ratio [%] | 640-nm intensity ratio [%] |
|---|---|---|---|---|---|---|---|---|---|---|---|
| | | Blue | Green | Red | | | | | | | |
| V-1 | Purple | BAM | BSS | CASON-1 | 2987 | −3.3 | 97 | 88 | 631 | 97 | 100 |
| V-2 | Purple | BAM | BSS | CASON-2 | 2987 | −3.1 | 96 | 76 | 624 | 101 | 97 |
| V-3 | Purple | BAM | BSS | CASON-2, CASN-1 | 2951 | −4.2 | 97 | 98 | 635 | 95 | 104 |
| V-4 | Purple | BAM | BSS | CASON-2, CASN-1 | 2983 | −2.8 | 96 | 93 | 636 | 92 | 108 |
| V-5 | Purple | BAM | BSS | SBS | 2840 | −5.1 | 65 | −60 | 591 | 140 | 53 |
| V-6 | Purple | BAM | BSS | SCASN-1 | 2725 | −5.0 | 92 | 79 | 620 | 93 | 96 |
| V-7 | Purple | BAM | BSS | CASN-1 | 3004 | −2.5 | 69 | −21 | 652 | 62 | 157 |
| V-8 | Purple | SCA | BSS | CASON-1 | 2990 | −3.5 | 94 | 88 | 635 | 95 | 101 |
| V-9 | Purple | SCA | BSS | CASON-2 | 3049 | −1.7 | 92 | 73 | 629 | 99 | 96 |
| V-10 | Purple | SBCA | β-SiAlON | CASON-1 | 3030 | −1.7 | 95 | 85 | 634 | 96 | 100 |
| V-11 | Purple | SBCA | BSON | CASON-1 | 3085 | −1.7 | 96 | 84 | 633 | 98 | 99 |

TABLE 4-continued

| Sample name | LED element | Phosphor type Blue | Phosphor type Green | Phosphor type Red | Correlated color temperature [K] | Duv | Ra | R9 | Maximum wavelength in red spectral region [nm] | 580-nm intensity ratio [%] | 640-nm intensity ratio [%] |
|---|---|---|---|---|---|---|---|---|---|---|---|
| V-12 | Purple | BAM | BSS | CASON-1 | 5547 | 1.1 | 95 | 81 | 627 | 91 | 111 |
| V-13 | Purple | BAM | β-SiAlON | CASON-1 | 5463 | 1.7 | 91 | 90 | 626 | 93 | 101 |
| V-14 | Purple | SBCA | β-SiAlON | CASON-1 | 5469 | 3.8 | 96 | 94 | 631 | 90 | 106 |
| V-15 | Purple | SBCA | BSON | CASON-1 | 5565 | 3.0 | 97 | 93 | 628 | 93 | 106 |

TABLE 5

| Sample name | LED element | Phosphor type Blue | Phosphor type yellow | Phosphor type Red | Correlated color temperature [K] | Duv | Ra | R9 | Maximum wavelength in red spectral region [nm] | 580-nm intensity ratio [%] | 640-nm intensity ratio [%] |
|---|---|---|---|---|---|---|---|---|---|---|---|
| B-1 | Blue | BSS | — | CASON-1 | 2972 | −2.3 | 97 | 96 | 636 | 91 | 107 |
| B-2 | Blue | BSS | — | CASON-2 | 3036 | −0.6 | 96 | 90 | 631 | 94 | 102 |
| B-3 | Blue | CSMS | — | SCASN-1 | 3030 | −1.8 | 89 | 43 | 616 | 109 | 83 |
| B-4 | Blue | CSO | — | SCASN-1 | 2903 | −3.4 | 88 | 37 | 611 | 110 | 82 |
| B-5 | Blue | — | YAG | CASN-2 | 2659 | −0.7 | 83 | 40 | 621 | 107 | 86 |
| B-6 | Blue | CSMS | — | CASN-2 | 2666 | −0.3 | 95 | 93 | 637 | 92 | 110 |
| B-7 | Blue | CSMS | YAG | CASN-2 | 2684 | −0.4 | 91 | 67 | 633 | 101 | 95 |
| B-8 | Blue | CSMS | YAG | CASN-2 | 2687 | −0.8 | 98 | 97 | 635 | 93 | 107 |
| B-9 | Blue | — | YAG | SCASN-2 | 2702 | 0.2 | 71 | −27 | 601 | 126 | 63 |
| B-10 | Blue | BSS | — | CASON-2 | 6488 | 1.7 | 94 | 95 | 626 | 92 | 105 |
| B-11 | Blue | CSO | — | SCASN-1 | 6420 | 3.0 | 90 | 45 | — | 108 | 79 |
| B-12 | Blue | — | YAG | — | 6475 | 4.3 | 69 | −34 | — | 116 | 53 |

Results obtained for white LEDs that emit warm white light are given first.

Focusing on V-1 that uses CASON-1 and on V-2 that use CASON-2 as red phosphors, the average color rendering index Ra is 97 in the former and 96 in the latter, as given in Table 4, both of which are very high. Regarding the special color rendering index R9, V-1 exhibits an appropriate value, of 88, but V-2 exhibits a slightly lower value, of 76.

Figure 11:
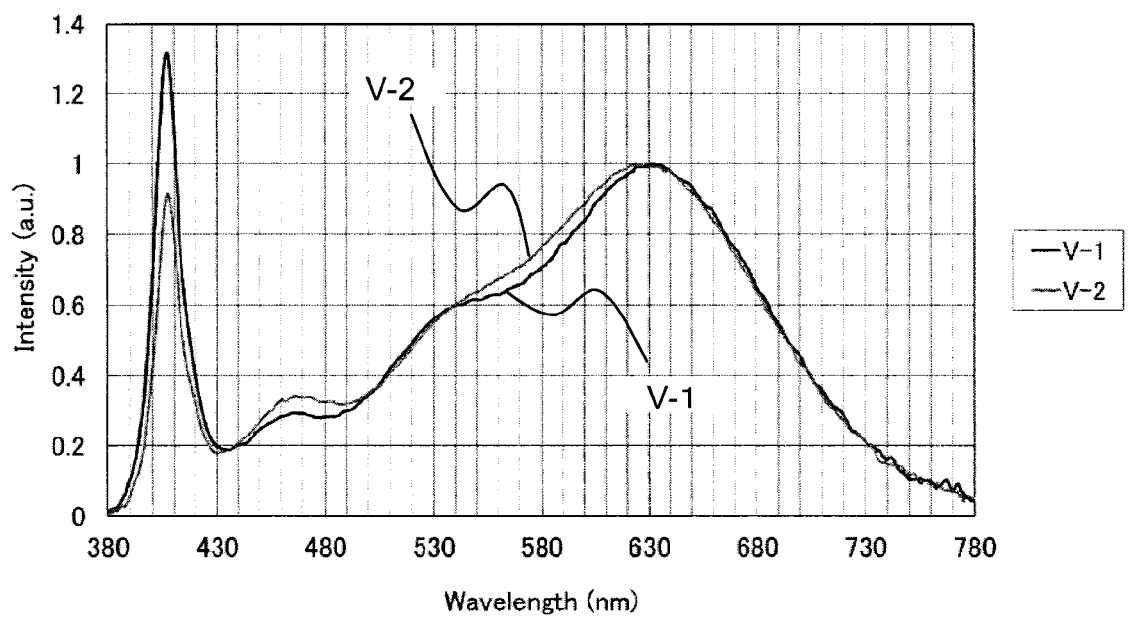
FIG. 11 shows an emission spectrum of a white LED.

In FIG. 11, the emission spectra of white LED samples V-1 and V-2 which each have been normalized with respect to the spectral intensity (peak intensity in red spectral region) observed at the maximum wavelength (631 nm for V-1, 624 nm for V-2) present in the red spectral region (wavelength, 590-780 nm) are shown so as to represent on one graph. It can be seen from FIG. 1 that the spectral intensity of V-2 exceeds the spectral intensity of V-1 in the wavelength range of 440-500 nm and 540-620 nm, and almost overlaps in the wavelength range longer than 630 nm.

Figure 12:
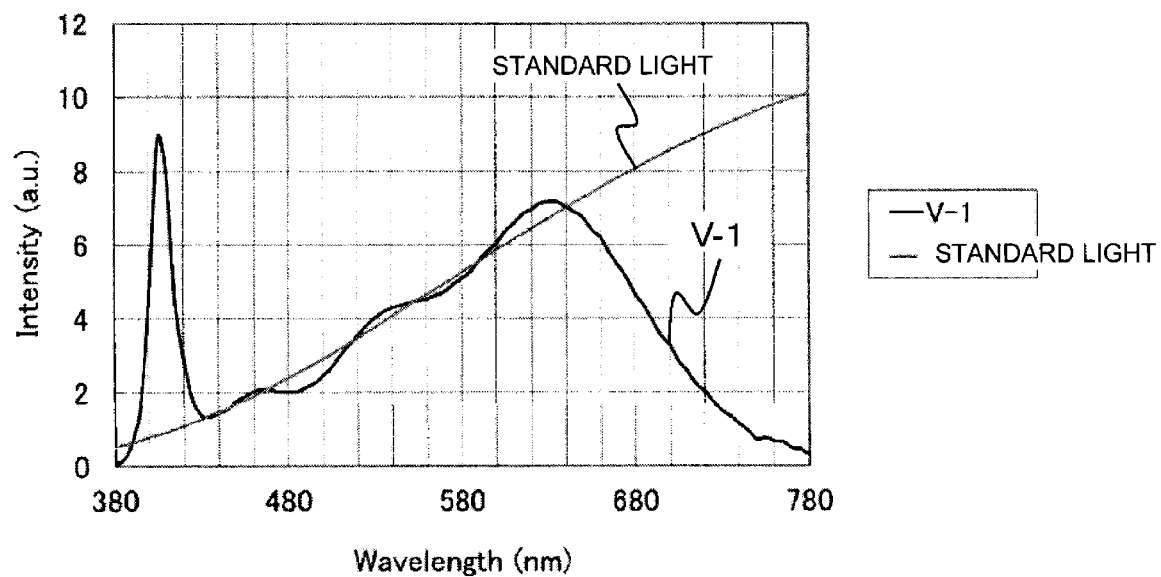
FIG. 12 shows an emission spectrum of a white LED and a spectrum of standard light for color rendering evaluation.
Figure 13:
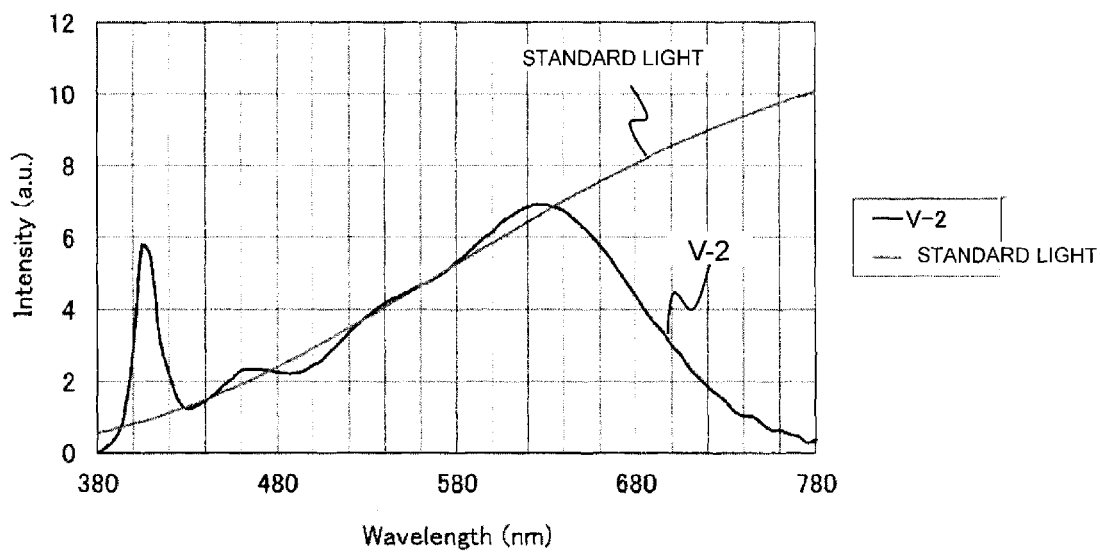
FIG. 13 shows an emission spectrum of a white LED and a spectrum of standard light for color rendering evaluation.

In FIG. 12, the emission spectrum of white LED sample V-1 and the spectrum of standard light for color rendering evaluation (light from a full radiator having the same correlated color temperature as V-1) are shown so as to overlap each other. The intensities of the two spectra have been normalized so that the spectra have the same value of luminous flux determined by mathematical expression (1). In FIG. 13, the emission spectrum of white LED sample V-2 and the spectrum of standard light for color rendering evaluation (light from a full radiator having the same correlated color temperature as V-2) are shown so as to overlap each other. The intensities of the two spectra have been normalized so that the spectra have the same value of luminous flux determined by mathematical expression (1).

As illustrated in FIG. 12 and FIG. 13, in either V-1 or V-2 the emission spectrum curve follows roughly the spectrum curve of standard light in a wavelength region at which the luminosity factor is highest, namely 520 to 580 nm. On the long wavelength-side, longer than 590 nm, the emission spectrum intensity of V-1 exceeds the emission spectrum intensity of standard light, up to wavelength 640 nm. The 640-nm intensity ratio of V-1 is 100%, as given in Table 4. In V-2, by contrast, the emission spectrum curve intersects the spectrum curve of standard light between 630 nm and 640 nm, and the 640-nm relative intensity is 97%. That is, at 640 nm the intensity of the emission spectrum drops below the spectrum intensity of standard light.

Figure 14:
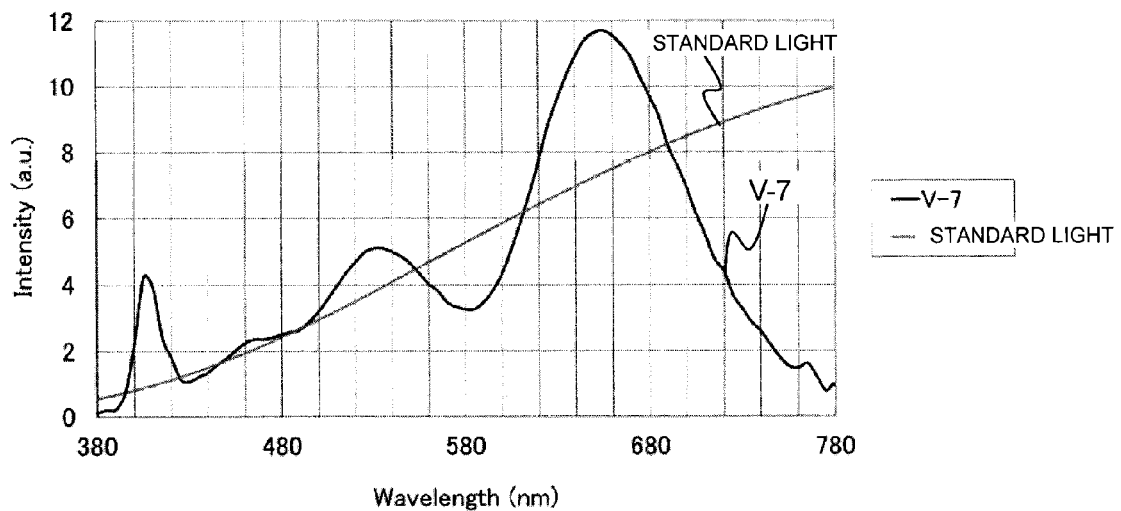
FIG. 14 shows an emission spectrum of a white LED and a spectrum of standard light for color rendering evaluation.

Table 6 gives results obtained through simulation of the emission characteristics of a white light-emitting device S-1 that emits combined light that results from mixing completely the respective primary white light emitted by V-2 and by V-7. Herein, V-7 is a white LED that uses, as a red phosphor, CASN-1 having the longest emission peak wavelength from among the red phosphors that are used. FIG. 14 illustrates the emission spectrum of V-7, together with the spectrum of standard light for color rendering evaluation (light from a full radiator having the same correlated color temperature as V-7). In FIG. 14, the intensities of two spectra are normalized so as to yield the same luminous flux determined on the basis of mathematical expression (1).

TABLE 6

Spectral characteristics of simulated white light-emitting device S-1
(white LED (a): V-2; white LED (b): V-7)

| | | | | | | | | | | | |
|---|---|---|---|---|---|---|---|---|---|---|---|
| Proportion of emission spectrum of white LED (a) in combined spectrum | 1.0 | 0.9 | 0.8 | 0.7 | 0.6 | 0.5 | 0.4 | 0.3 | 0.2 | 0.1 | 0.0 |
| Proportion of emission spectrum of white LED (b) in combined spectrum | 0.0 | 0.1 | 0.2 | 0.3 | 0.4 | 0.5 | 0.6 | 0.7 | 0.8 | 0.9 | 1.0 |
| Chromaticity x coordinate values | 0.433 | 0.433 | 0.433 | 0.433 | 0.433 | 0.433 | 0.433 | 0.433 | 0.433 | 0.433 | 0.433 |
| y | 0.395 | 0.395 | 0.395 | 0.395 | 0.396 | 0.396 | 0.396 | 0.396 | 0.396 | 0.396 | 0.397 |
| Correlated color temperature [K] | 2987 | 2988 | 2989 | 2990 | 2992 | 2993 | 2995 | 2997 | 2999 | 3002 | 3004 |
| Duv | −3.1 | −3.1 | −3.1 | −3.0 | −3.0 | −2.9 | −2.9 | −2.8 | −2.7 | −2.6 | −2.5 |
| Ra | 96 | 97 | 98 | 96 | 94 | 91 | 88 | 84 | 80 | 75 | 69 |
| R9 | 76 | 85 | 95 | 94 | 82 | 69 | 55 | 39 | 21 | 1 | −21 |
| Maximum wavelength in red spectral region [nm] | 624 | 630 | 639 | 639 | 643 | 644 | 644 | 649 | 652 | 652 | 652 |
| 580-nm intensity ratio [%] | 101 | 99 | 96 | 93 | 90 | 87 | 83 | 79 | 74 | 68 | 62 |
| 640-nm intensity ratio [%] | 97 | 100 | 104 | 108 | 113 | 118 | 124 | 131 | 138 | 147 | 157 |

In the emission characteristic simulation of the white light-emitting device S-1, the emission spectra of V-2 and V-7, normalized with respect to luminous flux, are put together in various proportions to yield a combined spectrum, and the chromaticity coordinate values, correlated color temperature, Duv, Ra, R9, 580-nm intensity ratio and 640-nm intensity ratio are calculated on the basis of the combined spectrum. In Table 6, the columns in which, for instance, the "proportion of emission spectrum of white LED (a) in the combined spectrum" is 0.4 and the "proportion of emission spectrum of white LED (b) in the combined spectrum" is 0.6 give the emission characteristics of the white light-emitting device S-1, such that the combined spectrum obtained by putting together the emission spectrum of V-2 which has been normalized with respect to luminous flux and the emission spectrum of V-7 which has been normalized with respect to luminous flux, in a proportion of 4:6, is the spectrum of output light.

Figure 15:
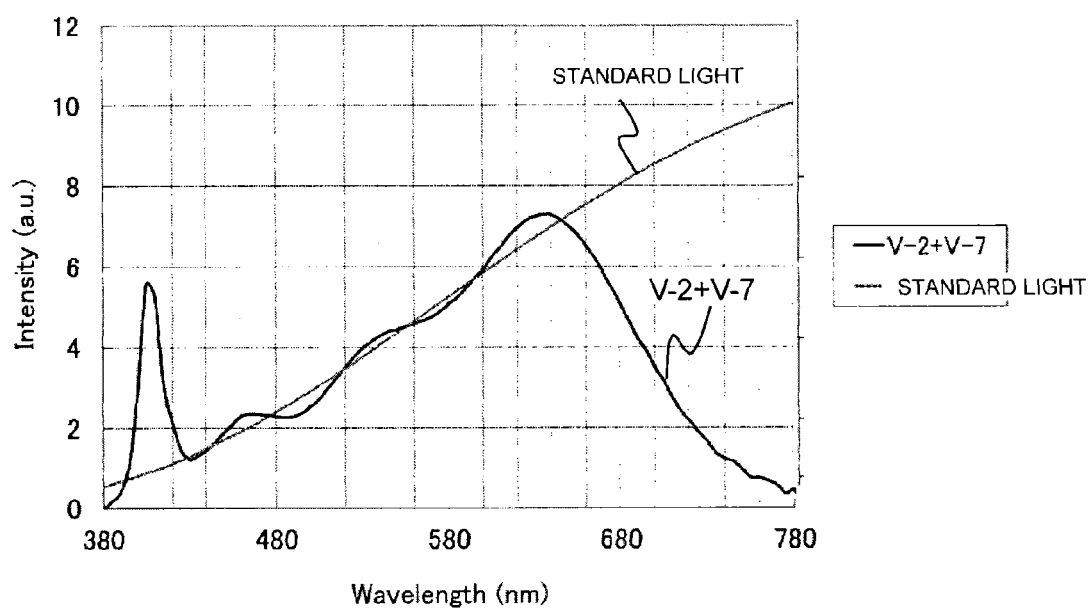
FIG. 15 shows a combined spectrum and a spectrum of standard light for color rendering evaluation.

According to the result of simulation shown in Table 6, the Ra and R9 of simulated white light-emitting devices S-1 are maximal when the spectrum of the outputted light is a combined spectrum obtained by putting the emission spectrum of V-2 and the emission spectrum of V-7 together in a proportion of 8:2 (Ra=98, R9=95). This device has a 640-nm intensity ration of 104%. This combined spectrum is shown in FIG. 15 together with the spectrum of standard light for color rendering evaluation. In FIG. 15, the intensities of the two spectra have been normalized so that the spectra have the same value of luminous flux determined by mathematical expression (1).

Figure 16:
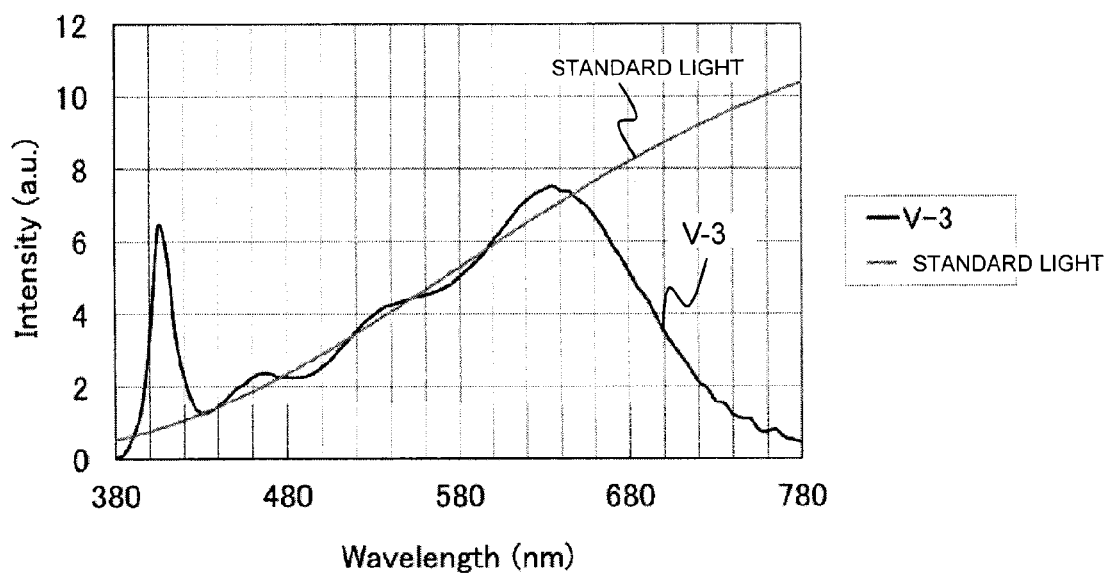
FIG. 16 shows an emission spectrum of a white LED and a spectrum of standard light for color rendering evaluation.
Figure 17:
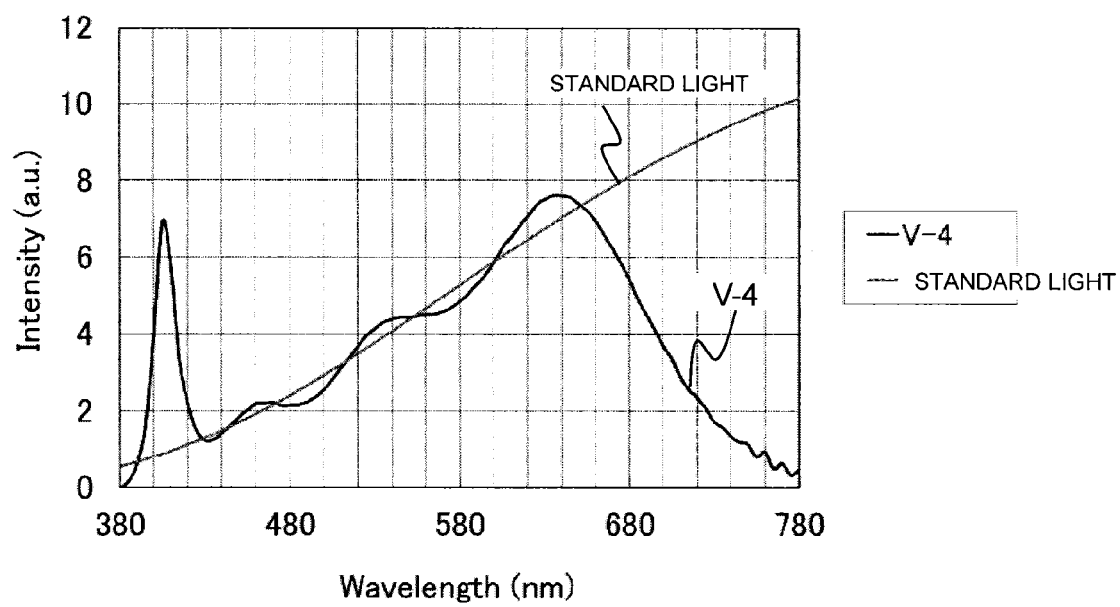
FIG. 17 shows an emission spectrum of a white LED and a spectrum of standard light for color rendering evaluation.
Figure 18:
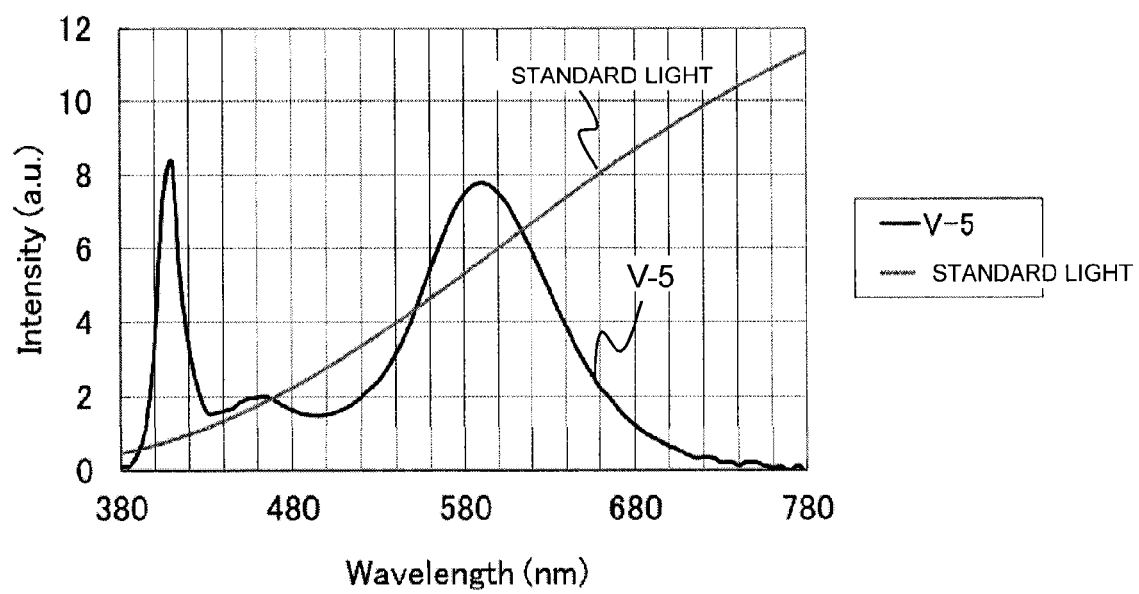
FIG. 18 shows an emission spectrum of a white LED and a spectrum of standard light for color rendering evaluation.
Figure 19:
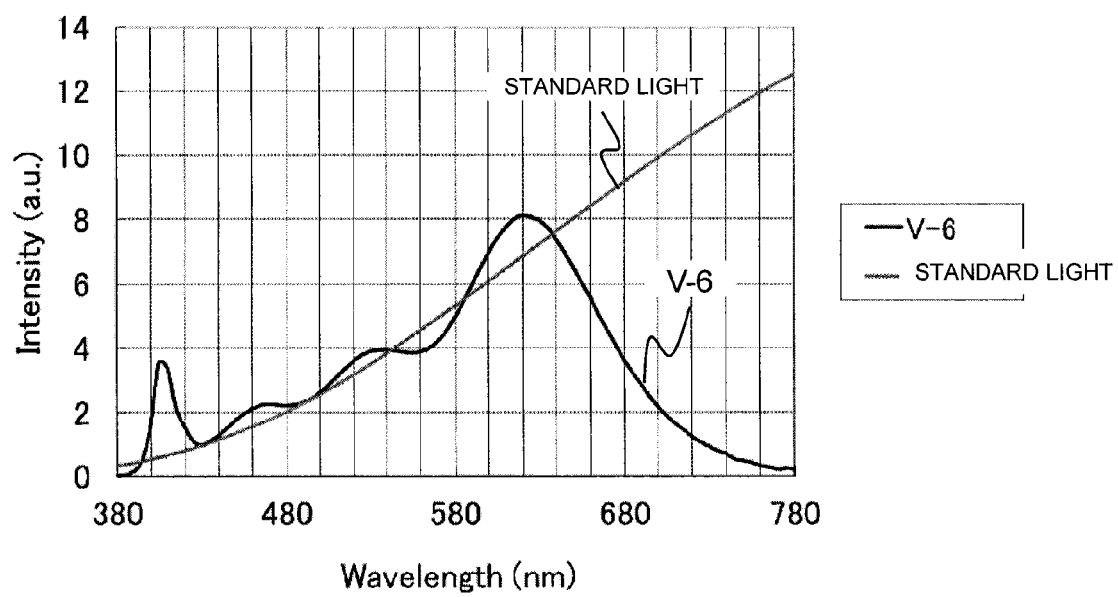
FIG. 19 shows an emission spectrum of a white LED and a spectrum of standard light for color rendering evaluation.
Figure 20:
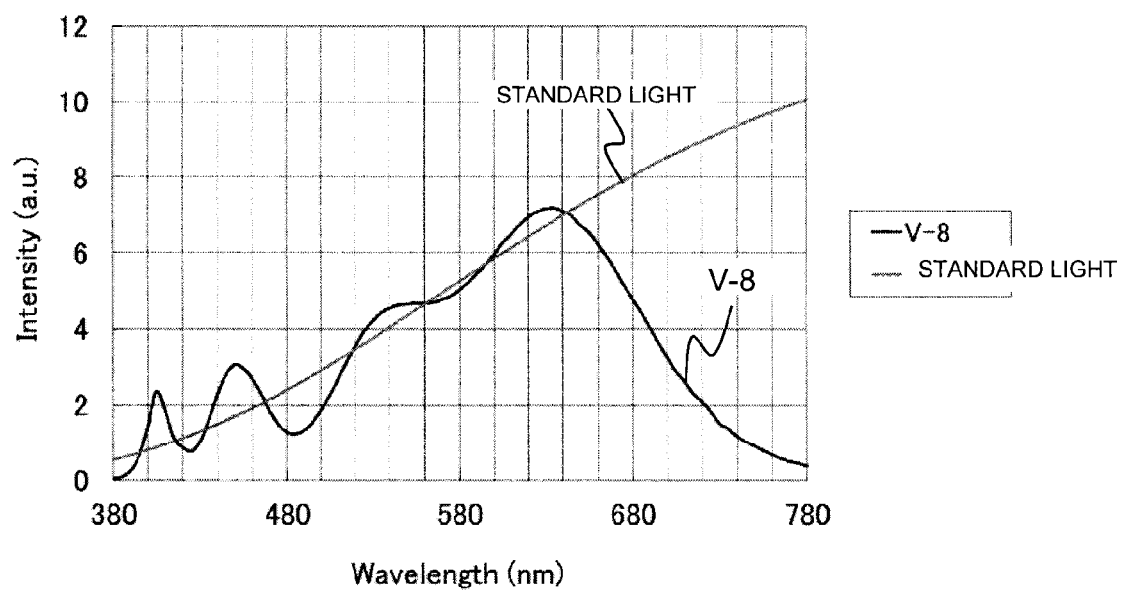
FIG. 20 shows an emission spectrum of a white LED and a spectrum of standard light for color rendering evaluation.
Figure 21:
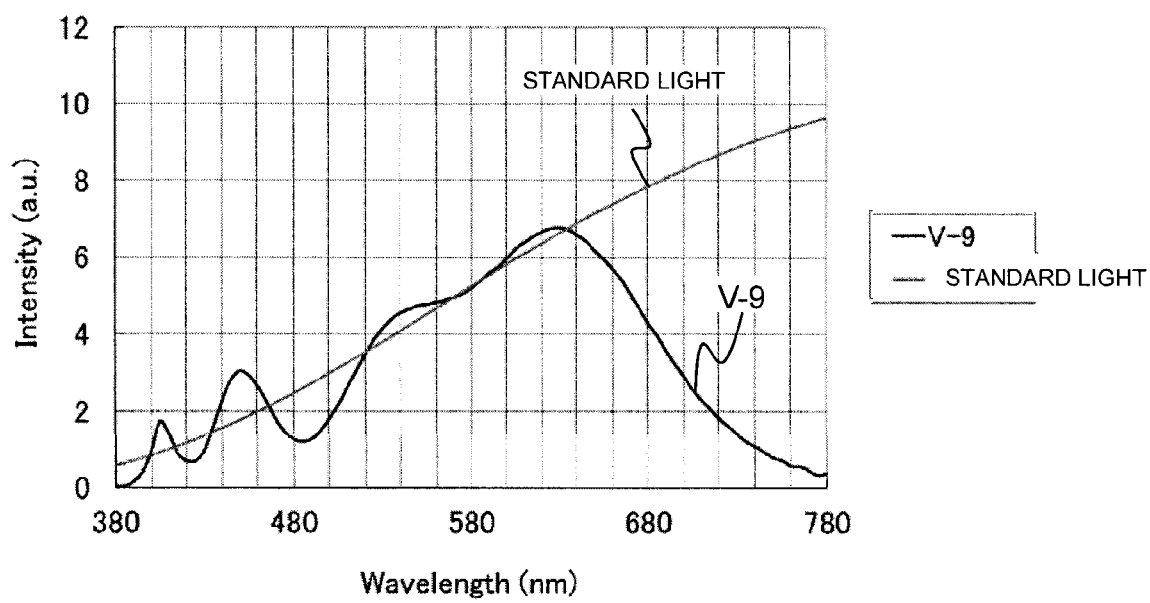
FIG. 21 shows an emission spectrum of a white LED and a spectrum of standard light for color rendering evaluation.
Figure 22:
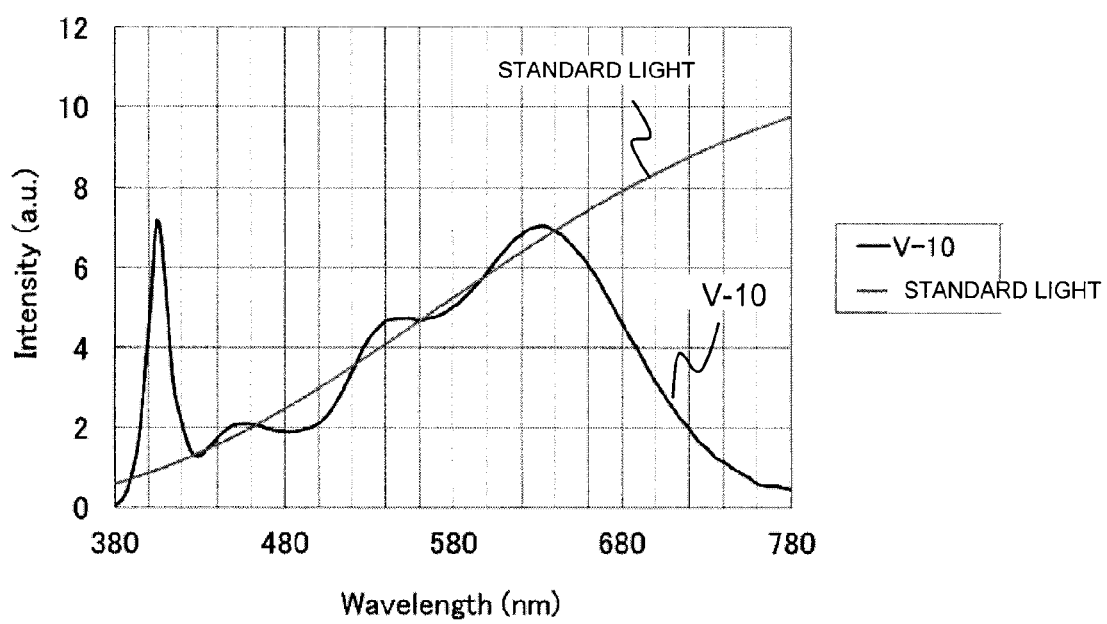
FIG. 22 shows an emission spectrum of a white LED and a spectrum of standard light for color rendering evaluation.
Figure 23:
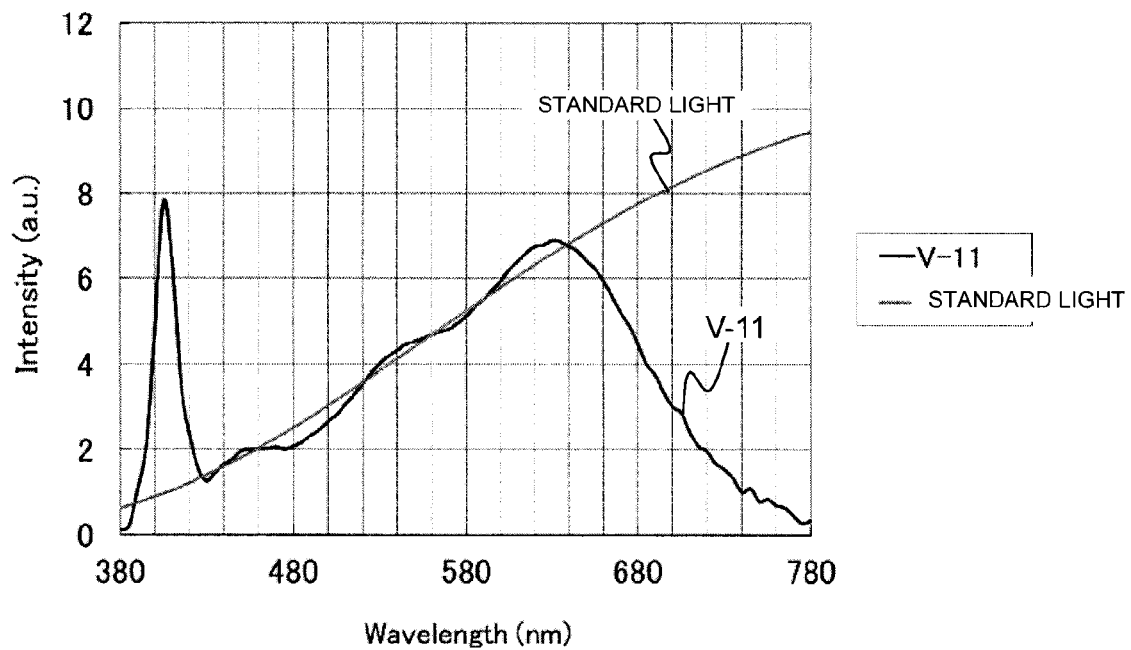
FIG. 23 shows an emission spectrum of a white LED and a spectrum of standard light for color rendering evaluation.
Figure 24:
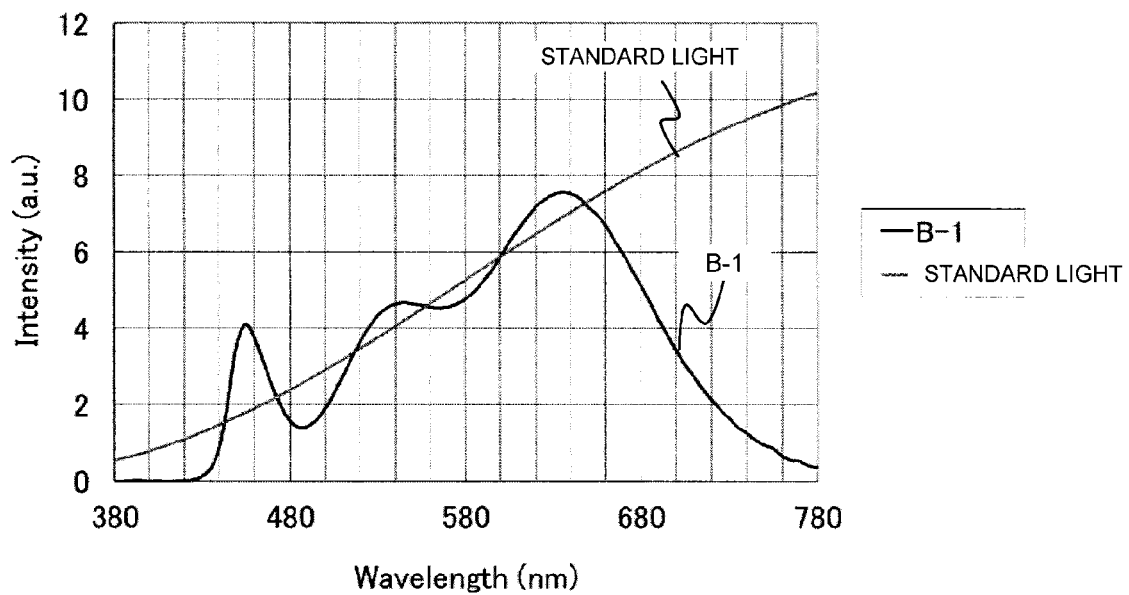
FIG. 24 shows an emission spectrum of a white LED and a spectrum of standard light for color rendering evaluation.
Figure 25:
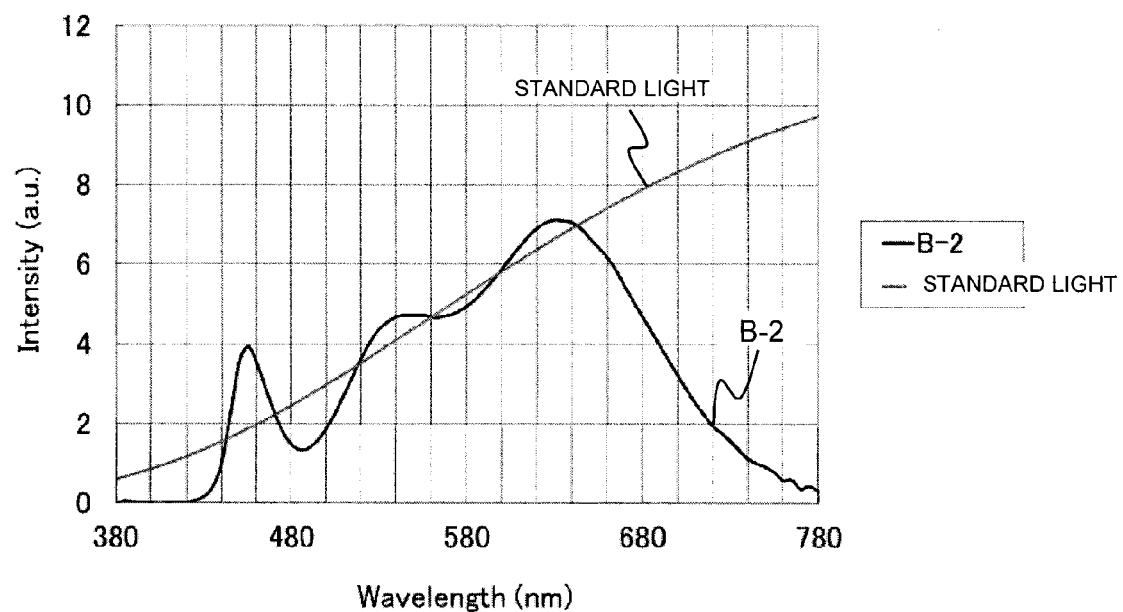
FIG. 25 shows an emission spectrum of a white LED and a spectrum of standard light for color rendering evaluation.
Figure 26:
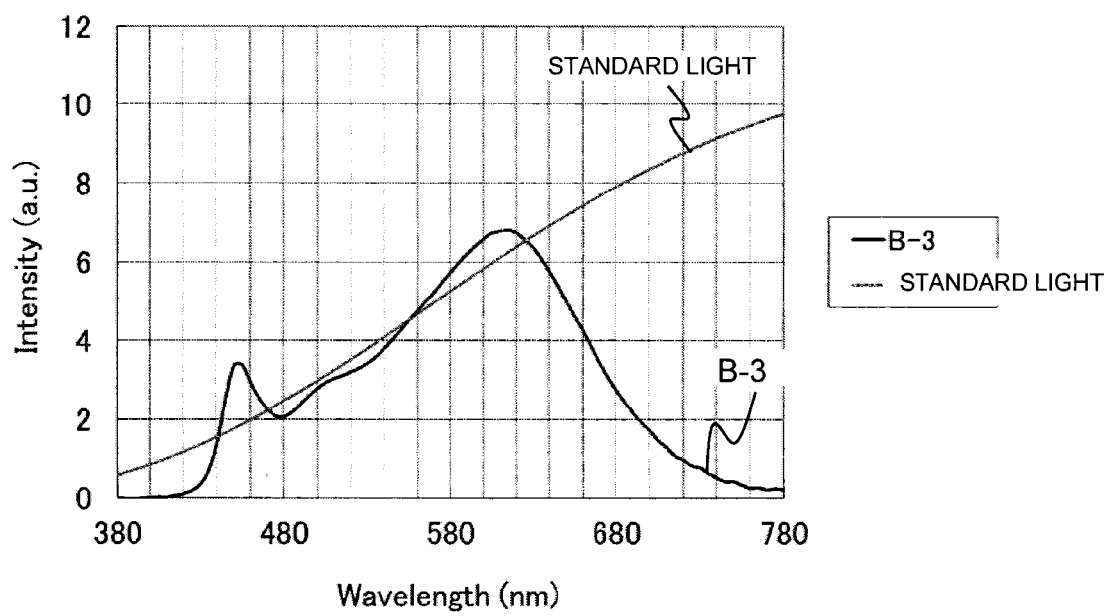
FIG. 26 shows an emission spectrum of a white LED and a spectrum of standard light for color rendering evaluation.
Figure 27:
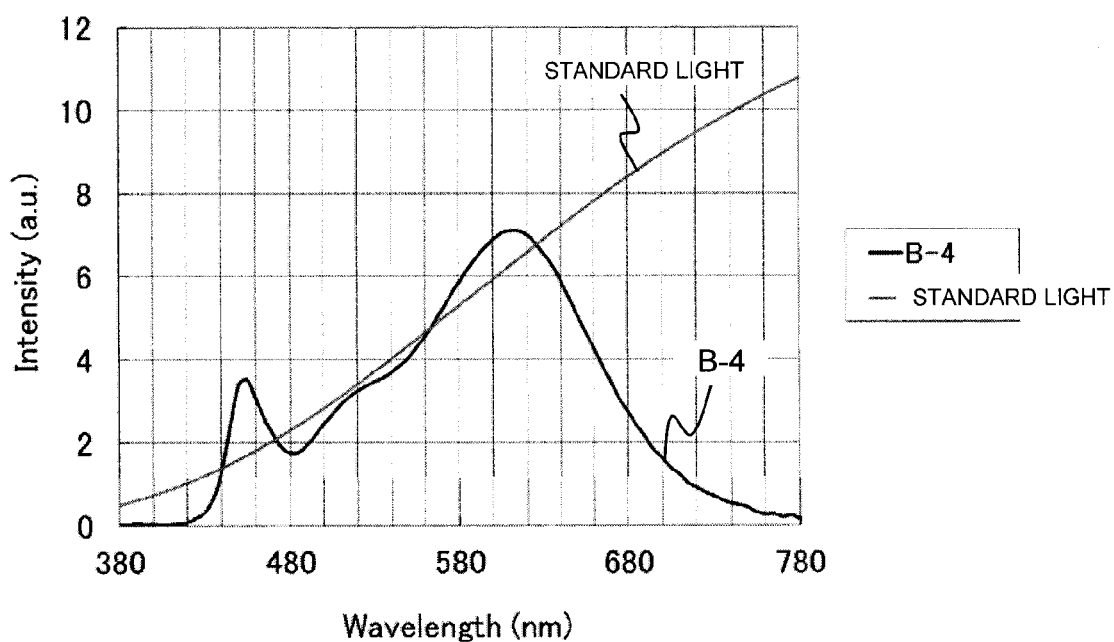
FIG. 27 shows an emission spectrum of a white LED and a spectrum of standard light for color rendering evaluation.
Figure 28:
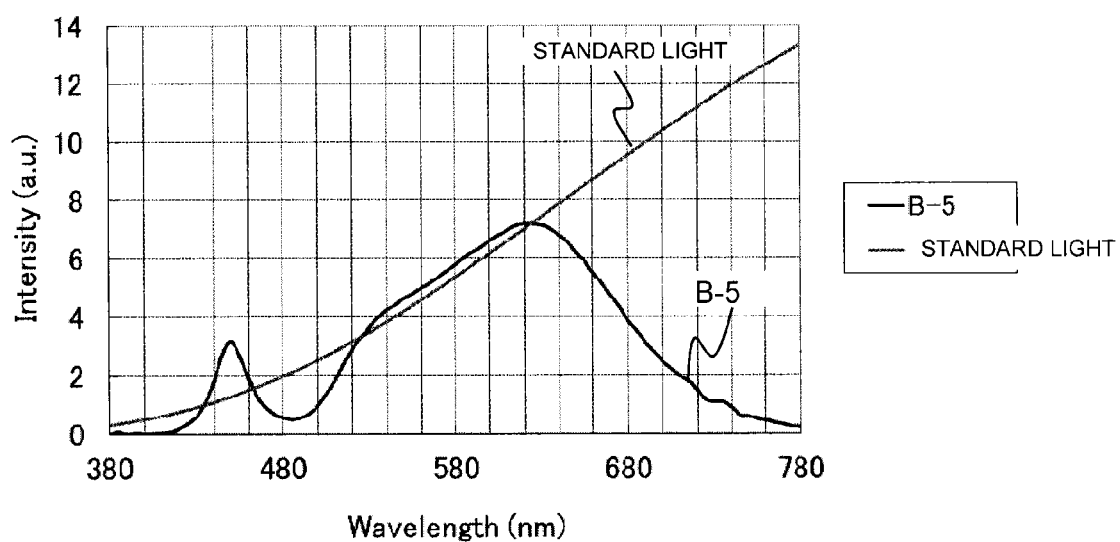
FIG. 28 shows an emission spectrum of a white LED and a spectrum of standard light for color rendering evaluation.
Figure 29:
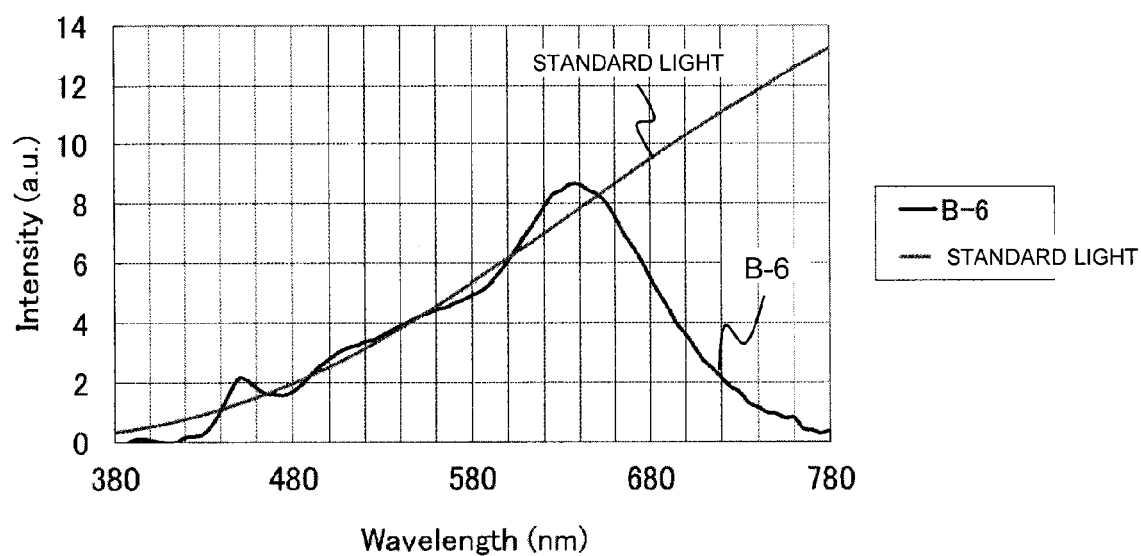
FIG. 29 shows an emission spectrum of a white LED and a spectrum of standard light for color rendering evaluation.
Figure 30:
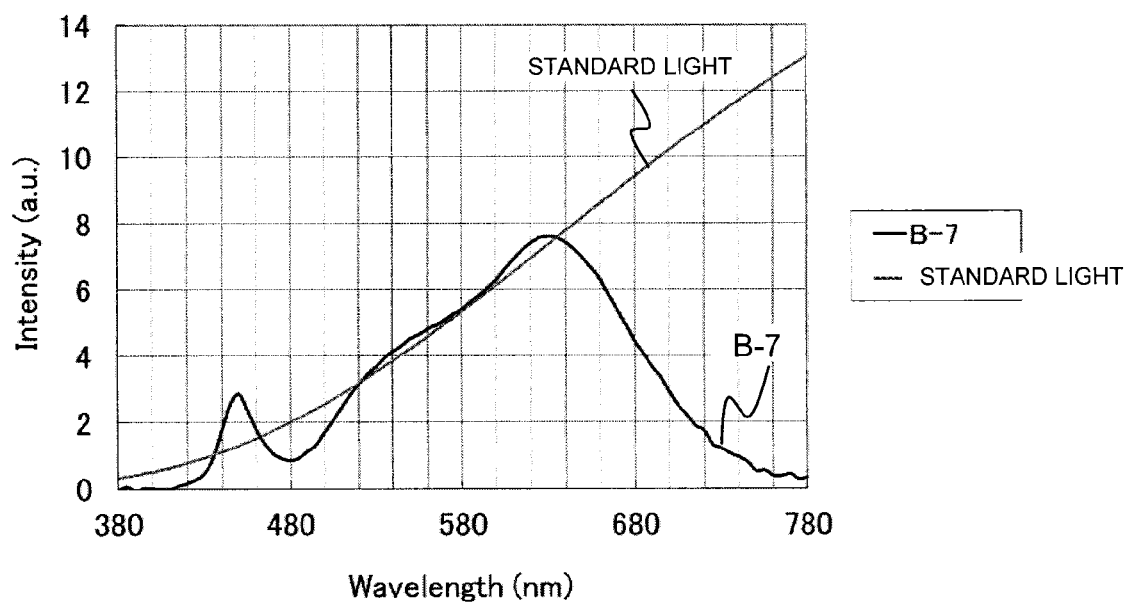
FIG. 30 shows an emission spectrum of a white LED and a spectrum of standard light for color rendering evaluation.
Figure 31:
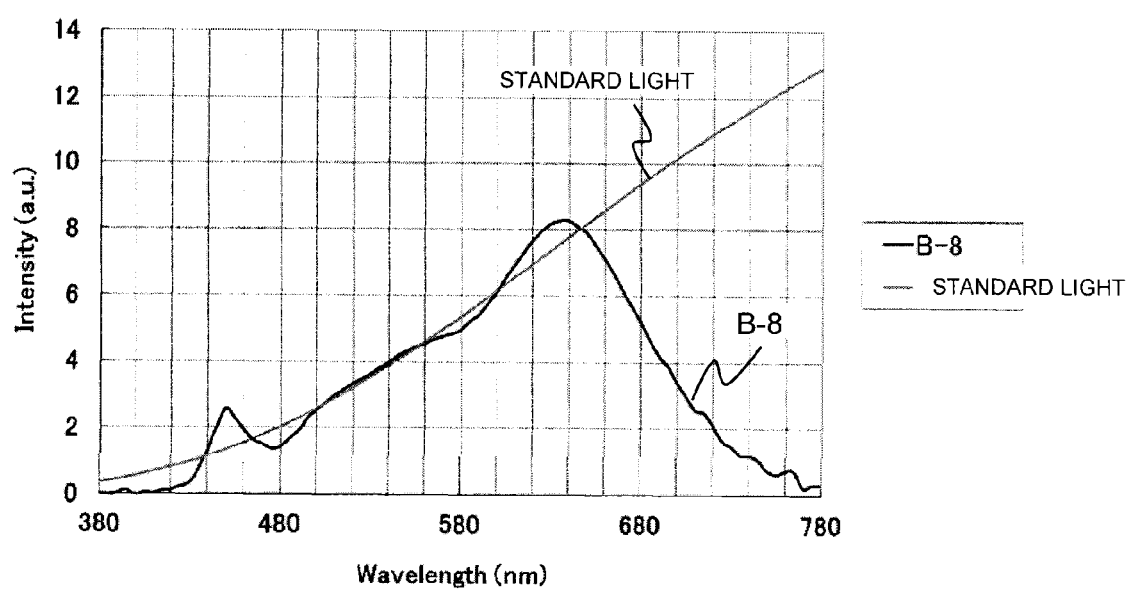
FIG. 31 shows an emission spectrum of a white LED and a spectrum of standard light for color rendering evaluation.
Figure 32:
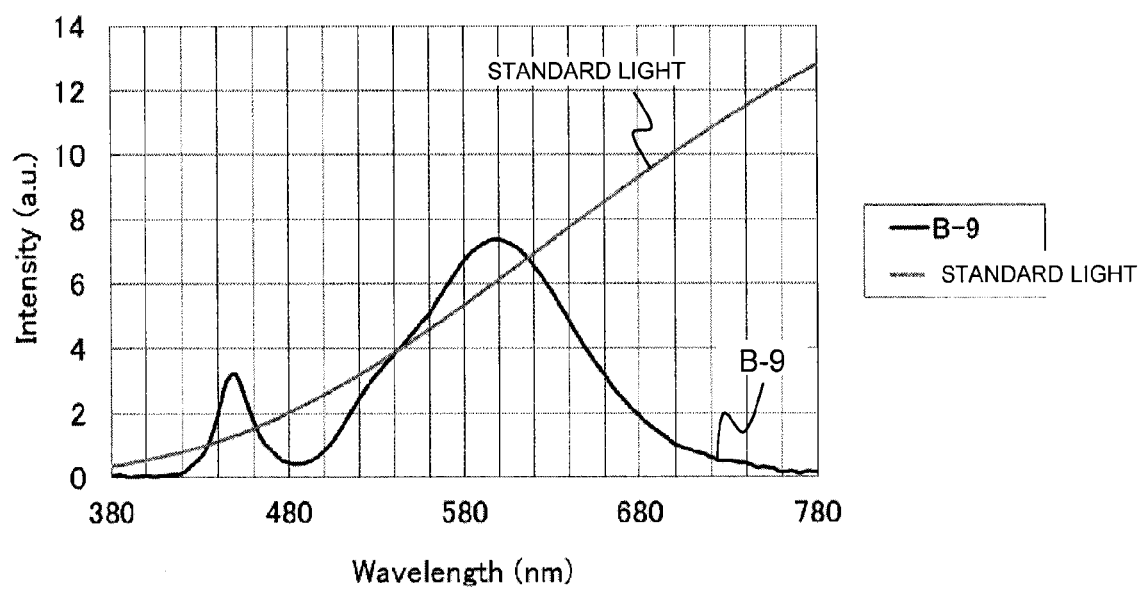
FIG. 32 shows an emission spectrum of a white LED and a spectrum of standard light for color rendering evaluation.

The emission spectra of V-3 and V-4, which are white LED samples actually produced using CASON-2 and CASN-1 as red phosphors, are shown in FIG. 16 and FIG. 17, respectively. The spectrum of standard light for color rendering evaluation is also shown in each figure. In each figure, the intensities of the emission spectrum of the white LED sample and of the spectrum of the standard light have been normalized so that the spectra have the same value of luminous flux determined by mathematical expression (1).

The simulation results in Table 6 show an interesting feature, namely that white LEDs of substantially the same color temperature and configured using the same excitation source (purple LED element) and the same phosphor (BAM, BSS, CASON-2 and CASN-1) may exhibit various R9 values ranging from 1 to 95. That is, using the same type of excitation source and phosphor does not necessarily result in a white LED that exhibits similar color rendering.

Sample V-3 having the emission spectrum illustrated in FIG. 16 exhibits very good values of Ra and R9 (Ra=97, R9=98). The same is true of V-4 that has the emission spectrum illustrated in FIG. 17 (Ra=96, R9=93). The 640-nm relative intensity of V-3 is 104%, and the 640-nm relative intensity of V-4 is 108%.

FIGS. 18 to 23 illustrate spectra of standard light for emission spectra of V-5, V-6 and V-8 to V-11, along with a spectrum of standard light for color rendering evaluation (light of a full radiator having the same correlated color temperature as that of a white LED). In each figure, the intensity of the emission spectra of the white LEDs and the intensity of the spectrum of standard light are normalized in such a manner that the luminous flux determined on the basis of mathematical expression (1) is equalized.

FIGS. 24 to 32 illustrates spectra of standard light for emission spectra of B-1 to B-9, along with a spectrum of standard light for color rendering evaluation (light of a full radiator having the same correlated color temperature as that of a white LED). In each figure, the intensity of the emission spectra of the white LEDs and the intensity of the spectrum of standard light are normalized in such a manner that the luminous flux determined on the basis of mathematical expression (1) is equalized.

Figure 33:
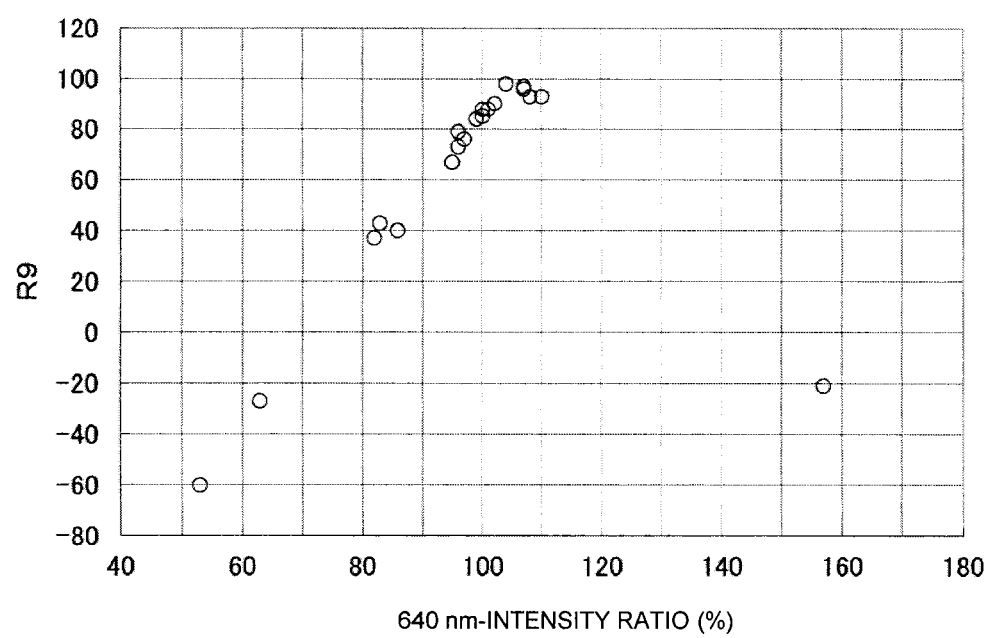
FIG. 33 shows a relationship between 640-nm intensity ratio and R9.

FIG. 33 is diagram wherein the 640-nm intensity ratio and special color rendering index R9 of twenty warm white LEDs, namely V-1 to V-11 that utilize a purple LED element, and B-1 to B-9 that utilize a blue LED element, are plotted in one graph. In the graph, the abscissa axis represents the 640-nm intensity ratio and the ordinate axis represents R9. The results of the plot reveal the existence of a specific trend that does not depend on the type of phosphor or the LED element that is used. Namely, R9 takes on a maximum value when the 640-nm intensity ratio ranges from 100 to 110%, and R9 drops when the 640-nm intensity ratio is lower than 100% and is higher than 110%.

Figure 34:
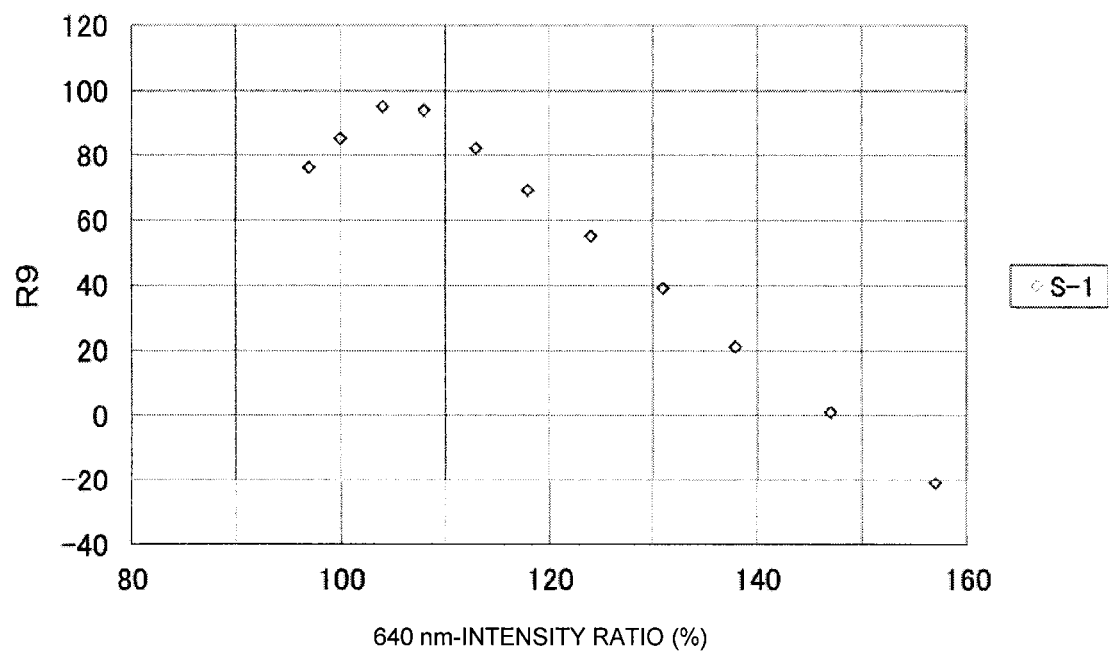
FIG. 34 shows a relationship between 640-nm intensity ratio and R9.

FIG. 34 is a graph in which there is plotted the relationship between the 640-nm intensity ratio and the special color rendering index R9 upon various changes in the proportion in which the emission spectrum of V-1 and the emission spectrum of V-7 are put together, in a combination of output light spectra in an emission characteristic simulation of the above-described white light-emitting device S-1. FIG. 34 illustrates the same trend as in FIG. 33.

The results of four simulations performed with a view to further verifying the above trend are given next.

Table 7 gives the results obtained through simulation of the emission characteristics of a white light-emitting device S-2 that emits combined light that results from mixing completely the respective primary white light emitted by V-6 and by V-7. The simulation method is the same as in the case of the above-described white light-emitting device S-1.

TABLE 7

Spectral characteristics of simulated white light-emitting device S-2
(white LED (a): V-6; white LED (b): V-7)

| | | | | | | | | | | | |
|---|---|---|---|---|---|---|---|---|---|---|---|
| Proportion of emission spectrum of white LED (a) in combined spectrum | 1.0 | 0.9 | 0.8 | 0.7 | 0.6 | 0.5 | 0.4 | 0.3 | 0.2 | 0.1 | 0.0 |
| Proportion of emission spectrum of white LED (b) in combined spectrum | 0.0 | 0.1 | 0.2 | 0.3 | 0.4 | 0.5 | 0.6 | 0.7 | 0.8 | 0.9 | 1.0 |
| Chromaticity x | 0.450 | 0.449 | 0.448 | 0.446 | 0.445 | 0.444 | 0.442 | 0.440 | 0.438 | 0.436 | 0.433 |
| coordinate y values | 0.395 | 0.395 | 0.395 | 0.395 | 0.396 | 0.396 | 0.396 | 0.396 | 0.396 | 0.396 | 0.397 |
| Correlated color temperature [K] | 2725 | 2741 | 2758 | 2777 | 2798 | 2822 | 2849 | 2879 | 2915 | 2956 | 3004 |
| Duv | −5.0 | −4.8 | −4.7 | −4.5 | −4.4 | −4.2 | −3.9 | −3.7 | −3.4 | −3.0 | −2.5 |
| Ra | 92 | 93 | 93 | 92 | 90 | 87 | 85 | 82 | 78 | 74 | 69 |
| R9 | 79 | 87 | 96 | 92 | 81 | 69 | 55 | 39 | 22 | 2 | −21 |
| Maximum wavelength in red spectral region [nm] | 620 | 626 | 627 | 629 | 634 | 637 | 639 | 644 | 649 | 652 | 652 |
| 580-nm intensity ratio [%] | 93 | 91 | 89 | 87 | 84 | 82 | 79 | 75 | 71 | 67 | 62 |
| 640-nm intensity ratio [%] | 96 | 99 | 103 | 107 | 112 | 117 | 123 | 130 | 137 | 146 | 157 |

Table 8 gives the results obtained through simulation of the emission characteristics of a white light-emitting device S-3 that emits combined light that results from mixing completely the respective primary white light emitted by V-5 and by V-7. The simulation method is the same as in the case of the above-described white light-emitting device S-1.

TABLE 8

Spectral characteristics of simulated white light-emitting device S-3
(white LED (a): V-5; white LED (b): V-7)

| | | | | | | | | | | | |
|---|---|---|---|---|---|---|---|---|---|---|---|
| Proportion of emission spectrum of white LED (a) in combined spectrum | 1.0 | 0.9 | 0.8 | 0.7 | 0.6 | 0.5 | 0.4 | 0.3 | 0.2 | 0.1 | 0.0 |
| Proportion of emission spectrum of white LED (b) in combined spectrum | 0.0 | 0.1 | 0.2 | 0.3 | 0.4 | 0.5 | 0.6 | 0.7 | 0.8 | 0.9 | 1.0 |
| Chromaticity x | 0.441 | 0.441 | 0.440 | 0.440 | 0.439 | 0.439 | 0.438 | 0.437 | 0.436 | 0.435 | 0.433 |
| coordinate y values | 0.393 | 0.393 | 0.393 | 0.393 | 0.393 | 0.394 | 0.394 | 0.395 | 0.395 | 0.396 | 0.397 |
| Correlated color temperature [K] | 2840 | 2846 | 2854 | 2863 | 2874 | 2886 | 2901 | 2919 | 2940 | 2968 | 3004 |
| Duv | −5.1 | −5.0 | −4.9 | −4.7 | −4.6 | −4.4 | −4.1 | −3.9 | −3.5 | −3.1 | −2.5 |

TABLE 8-continued

Spectral characteristics of simulated white light-emitting device S-3
(white LED (a): V-5; white LED (b): V-7)

| | | | | | | | | | | | |
|---|---|---|---|---|---|---|---|---|---|---|---|
| Ra | 65 | 68 | 71 | 75 | 79 | 84 | 90 | 96 | 93 | 83 | 69 |
| R9 | −60 | −46 | −30 | −12 | 7 | 30 | 56 | 87 | 77 | 33 | −21 |
| Maximum wavelength in red spectral region [nm] | 591 | 591 | 591 | 593 | 593 | 601 | 627 | 639 | 644 | 652 | 652 |
| 580-nm intensity ratio [%] | 141 | 137 | 133 | 129 | 124 | 118 | 111 | 102 | 92 | 79 | 62 |
| 640-nm intensity ratio [%] | 53 | 57 | 62 | 67 | 74 | 82 | 91 | 102 | 116 | 134 | 157 |

Table 9 gives the results obtained through simulation of the emission characteristics of a white light-emitting device S-4 that emits combined light that results from mixing completely the respective primary white light emitted by V-5 and by V-1. The simulation method is the same as in the case of the above-described white light-emitting device S-1.

TABLE 9

Spectral characteristics of simulated white light-emitting device S-4
(white LED (a): V-5; white LED (b): V-1)

| | | | | | | | | | | | |
|---|---|---|---|---|---|---|---|---|---|---|---|
| Proportion of emission spectrum of white LED (a) in combined spectrum | 1.0 | 0.9 | 0.8 | 0.7 | 0.6 | 0.5 | 0.4 | 0.3 | 0.2 | 0.1 | 0.0 |
| Proportion of emission spectrum of white LED (b) in combined spectrum | 0.0 | 0.1 | 0.2 | 0.3 | 0.4 | 0.5 | 0.6 | 0.7 | 0.8 | 0.9 | 1.0 |
| Chromaticity coordinate values x | 0.441 | 0.440 | 0.440 | 0.439 | 0.438 | 0.438 | 0.437 | 0.436 | 0.435 | 0.434 | 0.433 |
| Chromaticity coordinate values y | 0.393 | 0.393 | 0.393 | 0.393 | 0.393 | 0.393 | 0.394 | 0.394 | 0.394 | 0.394 | 0.395 |
| Correlated color temperature [K] | 2840 | 2850 | 2861 | 2873 | 2886 | 2899 | 2914 | 2930 | 2947 | 2966 | 2987 |
| Duv | −5.1 | −5.0 | −4.8 | −4.7 | −4.5 | −4.4 | −4.2 | −4.0 | −3.8 | −3.6 | −3.3 |
| Ra | 65 | 67 | 70 | 73 | 76 | 79 | 83 | 86 | 90 | 94 | 97 |
| R9 | −60 | −48 | −36 | −24 | −10 | 4 | 19 | 35 | 51 | 69 | 88 |
| Maximum wavelength in red spectral region [nm] | 591 | 591 | 593 | 593 | 595 | 595 | 606 | 606 | 615 | 625 | 631 |
| 580-nm intensity ratio [%] | 141 | 137 | 134 | 130 | 127 | 122 | 118 | 113 | 108 | 103 | 97 |
| 640-nm intensity ratio [%] | 53 | 56 | 59 | 63 | 67 | 72 | 77 | 82 | 87 | 94 | 100 |

Table 10 gives the results obtained through simulation of the emission characteristics of a white light-emitting device S-5 that emits combined light that results from mixing completely the respective primary white light emitted by B-5 and by B-6. The simulation method is the same as in the case of the above-described white light-emitting device S-1.

TABLE 10

Spectral characteristics of simulated white light-emitting device S-5
(white LED (a): B-5; white LED (b): B-6)

| | | | | | | | | | | | |
|---|---|---|---|---|---|---|---|---|---|---|---|
| Proportion of emission spectrum of white LED (a) in combined spectrum | 1.0 | 0.9 | 0.8 | 0.7 | 0.6 | 0.5 | 0.4 | 0.3 | 0.2 | 0.1 | 0.0 |
| Proportion of emission spectrum of white LED (b) | 0.0 | 0.1 | 0.2 | 0.3 | 0.4 | 0.5 | 0.6 | 0.7 | 0.8 | 0.9 | 1.0 |

TABLE 10-continued

Spectral characteristics of simulated white light-emitting device S-5
(white LED (a): B-5; white LED (b): B-6)

| in combined spectrum | | | | | | | | | | | |
|---|---|---|---|---|---|---|---|---|---|---|---|
| Chromaticity x coordinate y values | 0.462 0.409 | 0.462 0.409 | 0.462 0.409 | 0.462 0.409 | 0.462 0.409 | 0.462 0.410 | 0.462 0.410 | 0.462 0.410 | 0.462 0.410 | 0.462 0.410 | 0.462 0.410 |
| Correlated color temperature [K] | 2659 | 2660 | 2660 | 2661 | 2661 | 2662 | 2663 | 2663 | 2664 | 2665 | 2666 |
| Duv | −0.7 | −0.7 | −0.7 | −0.6 | −0.6 | −0.6 | −0.5 | −0.5 | −0.4 | −0.4 | −0.3 |
| Ra | 83 | 85 | 86 | 88 | 90 | 92 | 94 | 96 | 98 | 98 | 95 |
| R9 | 40 | 45 | 51 | 57 | 63 | 69 | 76 | 83 | 90 | 98 | 93 |
| Maximum wavelength in red spectral region [nm] | 621 | 626 | 626 | 626 | 629 | 635 | 635 | 635 | 636 | 637 | 637 |
| 580-nm intensity ratio [%] | 107 | 106 | 105 | 104 | 102 | 101 | 99 | 98 | 96 | 94 | 92 |
| 640-nm intensity ratio [%] | 86 | 88 | 90 | 92 | 94 | 96 | 99 | 101 | 104 | 107 | 110 |

Figure 35:
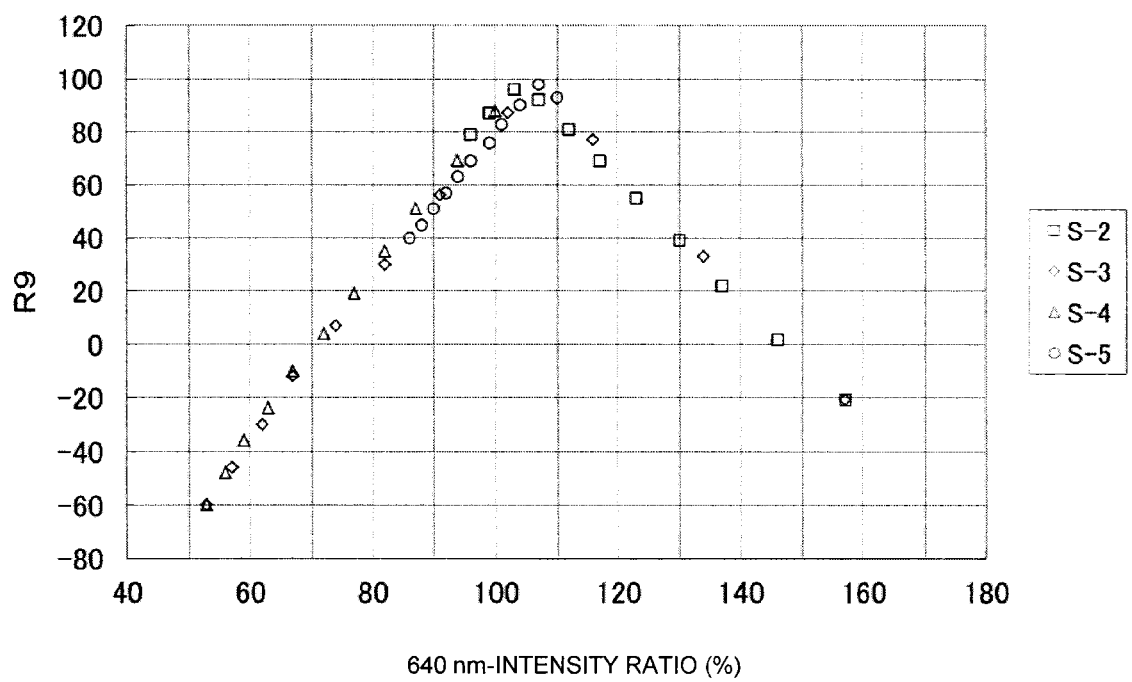
FIG. 35 shows a relationship between 640-nm intensity ratio and R9.

FIG. 35 is diagram wherein the relationship between the 640-nm intensity ratio and special color rendering index R9 of the above-described four white light-emitting devices S-2 to S-5, obtained by simulation, are plotted in one graph. FIG. 35 shows the same trend as in FIG. 33 and FIG. 34. Specifically, R9 takes on a maximum value when the 640-nm intensity ratio ranges from 100 to 110%, and R9 drops when the 640-nm intensity ratio is lower than 100% and higher than 110%.

Figure 36:
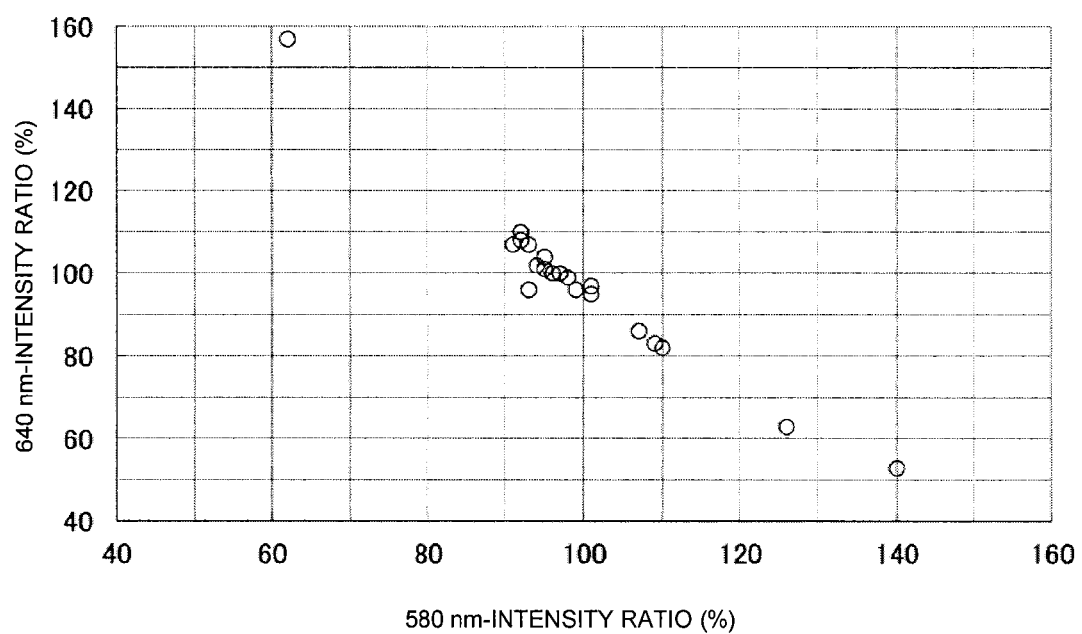
FIG. 36 shows a relationship between 580-nm intensity ratio and 640-nm intensity ratio.

FIG. 36 is diagram wherein the 580-nm intensity ratio and the 640-nm intensity ratio of twenty warm white LEDs, namely V-1 to V-11 that utilize a purple LED element, and B-1 to B-9 that utilize a blue LED element, are plotted in one graph. In the graph, the abscissa axis represents the 580-nm intensity ratio and the ordinate axis represents the 640-nm intensity ratio. The results of the plot indicate that the 640-nm intensity ratio tends to decrease as the 580-nm intensity ratio increases.

Figure 37:
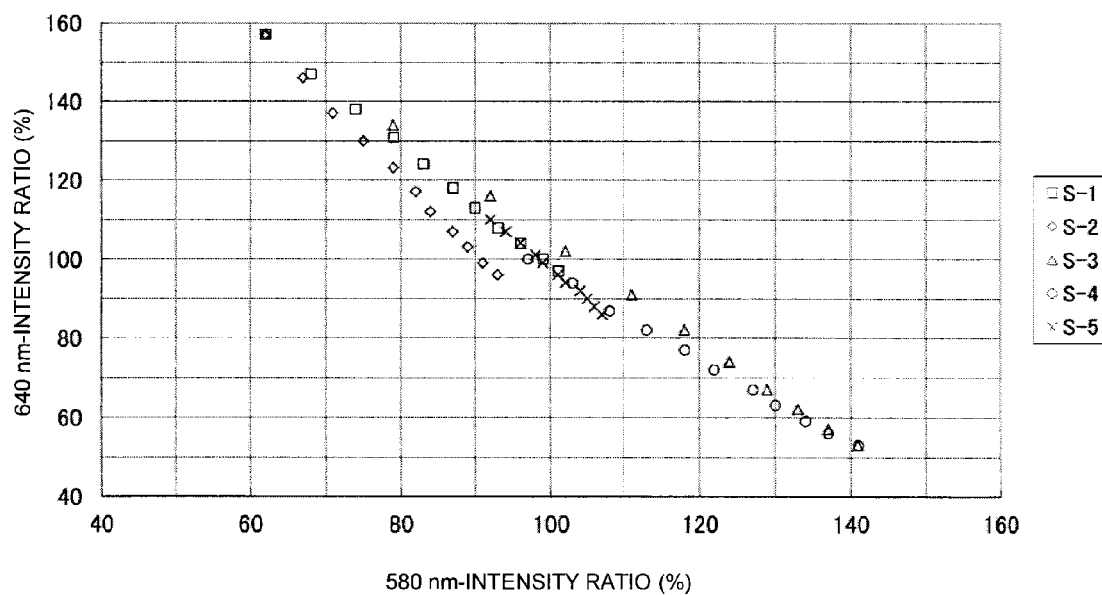
FIG. 37 shows a relationship between 580-nm intensity ratio and 640-nm intensity ratio.
Figure 38:
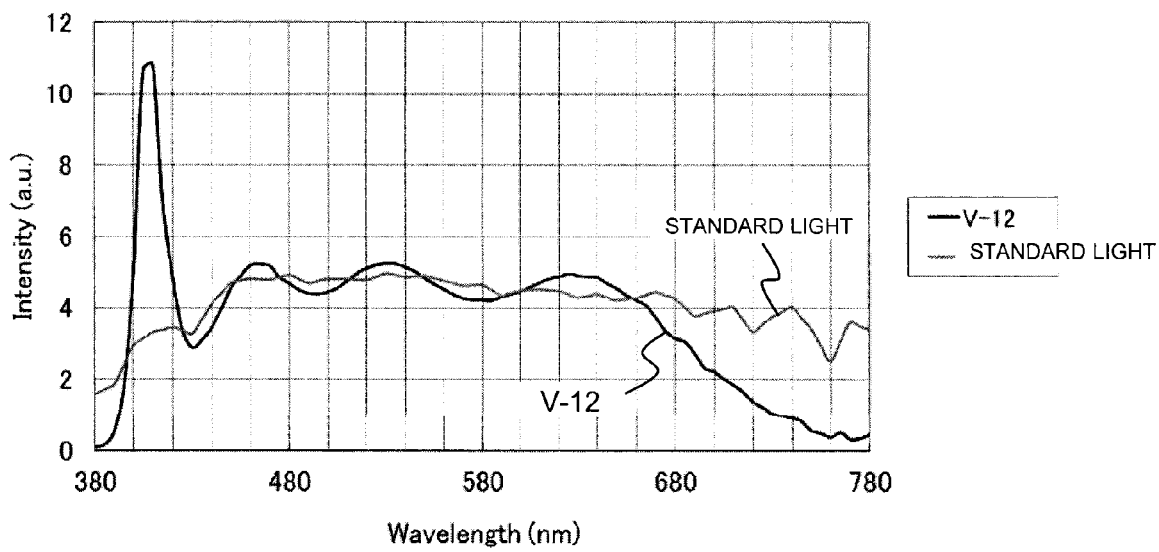
FIG. 38 shows an emission spectrum of a white LED and a spectrum of standard light for color rendering evaluation.
Figure 39:
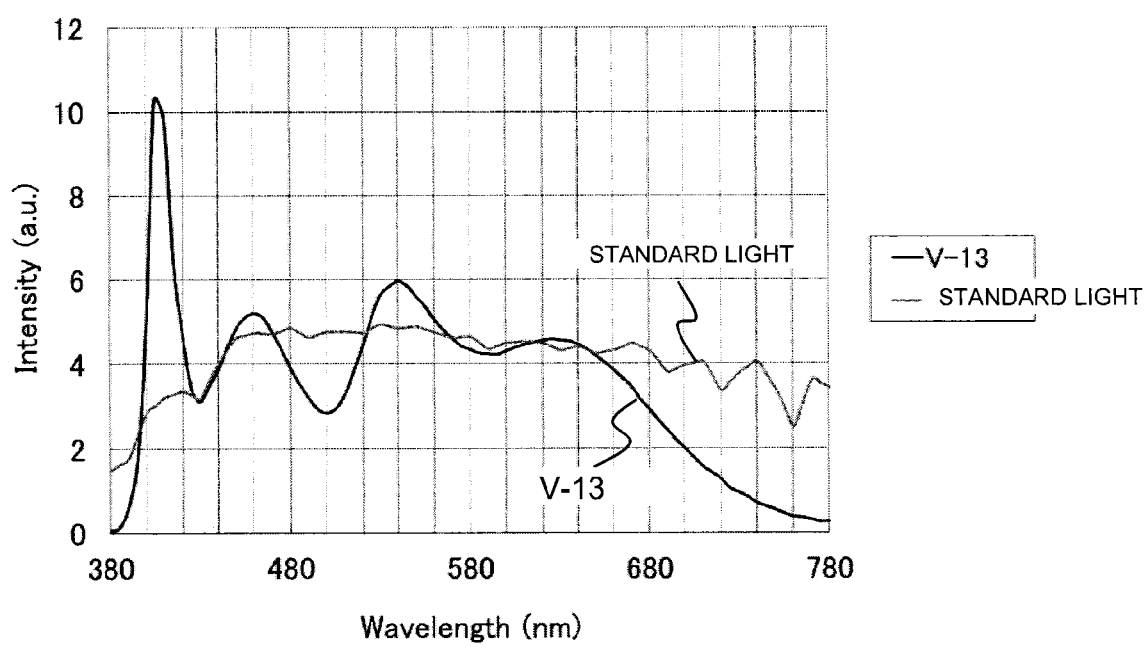
FIG. 39 shows an emission spectrum of a white LED and a spectrum of standard light for color rendering evaluation.
Figure 40:
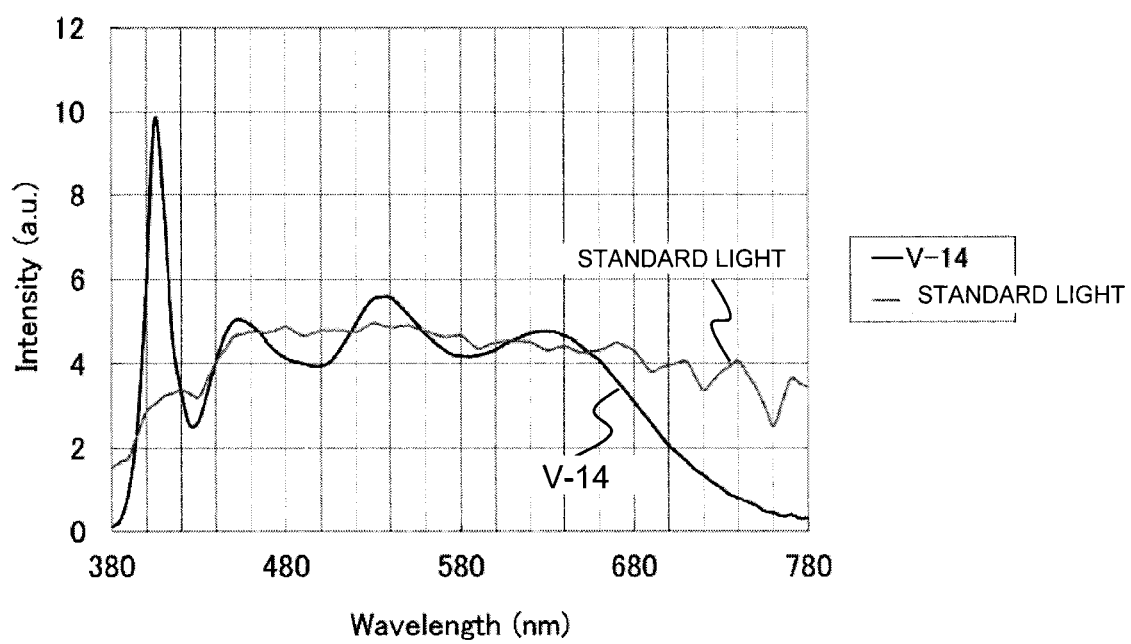
FIG. 40 shows an emission spectrum of a white LED and a spectrum of standard light for color rendering evaluation.
Figure 41:
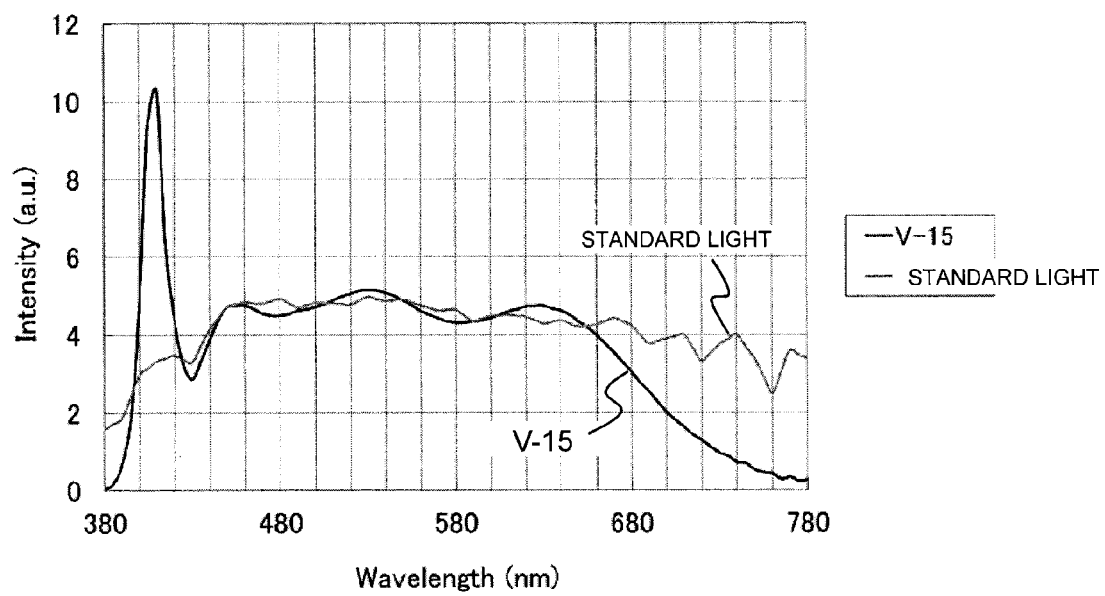
FIG. 41 shows an emission spectrum of a white LED and a spectrum of standard light for color rendering evaluation.

FIG. 37 illustrates a diagram wherein the relationship between the 580-nm intensity ratio and the 640-nm intensity ratio for the above-described five virtual white light-emitting devices S-1 to S-5, obtained by simulation, are plotted in one graph. FIG. 37 illustrates the same trend as that of FIG. 36, namely the 640-nm intensity ratio decreases as the 580-nm intensity ratio increases.

The results obtained for white LEDs that emit cool white light are given below.

FIGS. 38 to 41 illustrate emission spectra of V-12 to V-15 having correlated color temperatures of about 5500 K, along with a spectrum of standard light for color rendering evaluation (CIE daylight). In each figure, the intensity of the emission spectra of the white LEDs and the intensity of the spectrum of standard light are normalized in such a manner that the luminous flux determined on the basis of mathematical expression (1) is equalized. The special color rendering index R9 of V-12, for which 640-nm intensity ratio is 111%, is 81, which is a satisfactory value. In V-13 to V-15, for which the 640-nm intensity ratio ranges from 100 to 110%, R9 takes on a higher value than the above, being 90 or more in all cases.

Figure 42:
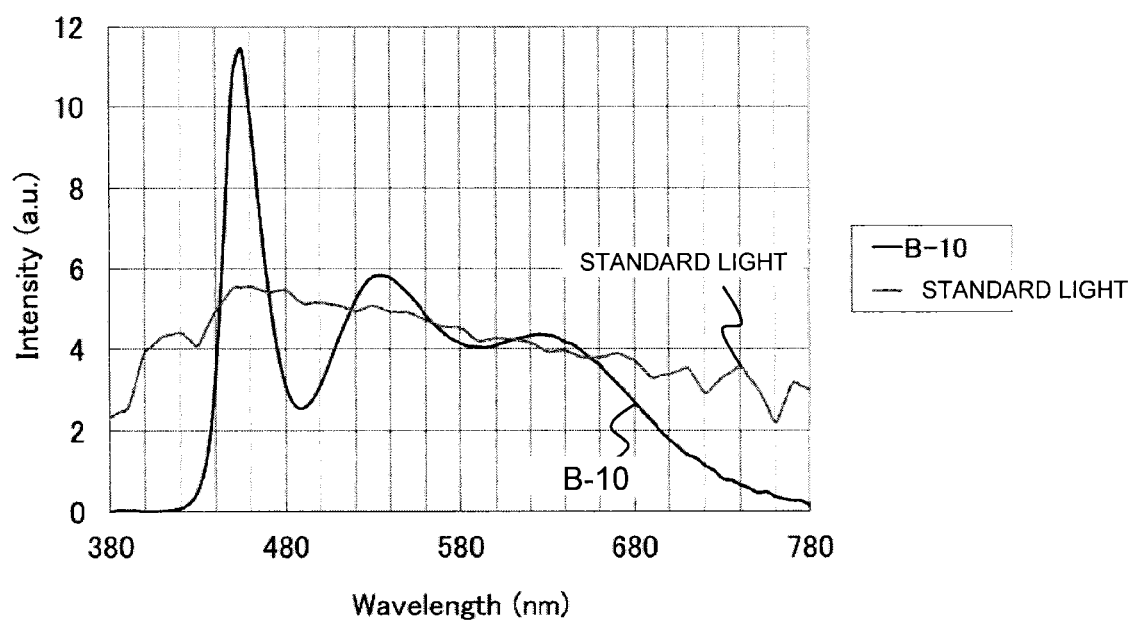
FIG. 42 shows an emission spectrum of a white LED and a spectrum of standard light for color rendering evaluation.
Figure 43:
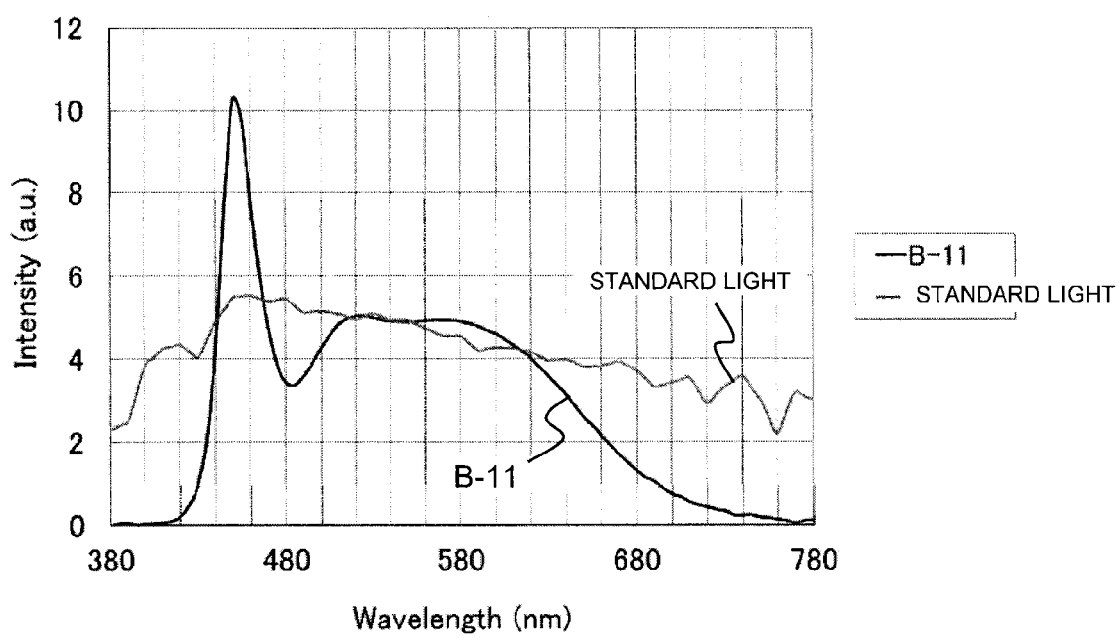
FIG. 43 shows an emission spectrum of a white LED and a spectrum of standard light for color rendering evaluation.
Figure 44:
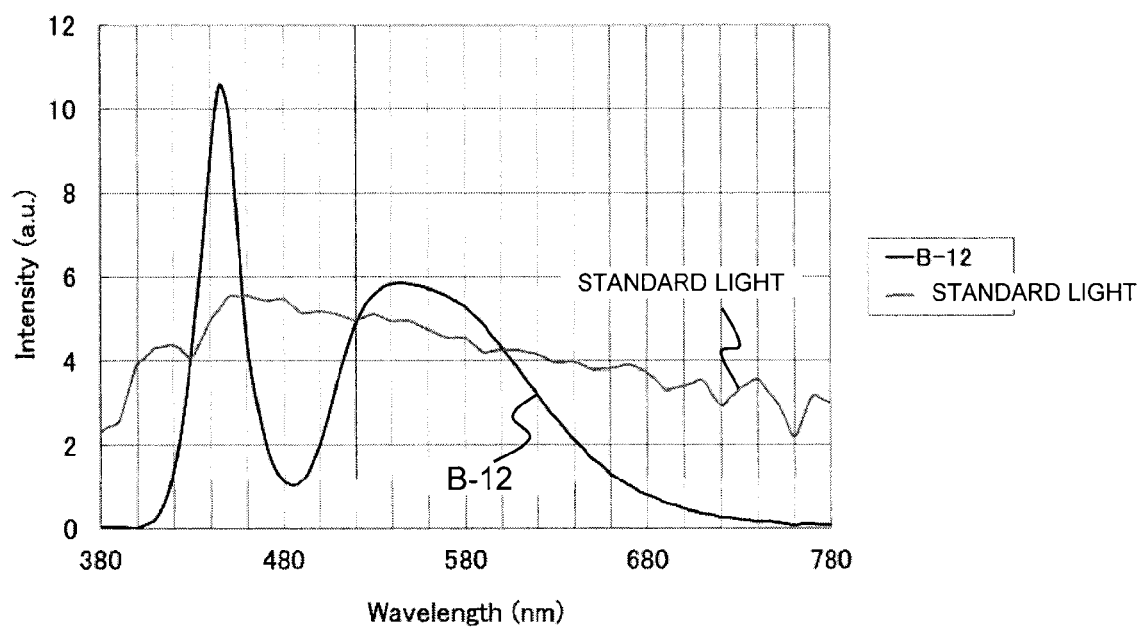
FIG. 44 shows an emission spectrum of a white LED and a spectrum of standard light for color rendering evaluation.

FIGS. 42 to 44 illustrate emission spectra of B-10 to B-12 having correlated color temperatures ranging from 6400 to 6500 K, along with a spectrum of standard light for color rendering evaluation (CIE daylight). In each figure, the intensity of the emission spectra of the white LEDs and the intensity of the spectrum of standard light are normalized in such a manner that the luminous flux determined on the basis of mathematical expression (1) is equalized. The special color rendering index R9 of B-10, for which the 640-nm intensity ratio is 105%, is 95, which is a very good value. By contrast, the special color rendering index R9 of B-11 and B-12, for which the 640-nm intensity ratio are 79% and 53%, is poor, of 45 and −34, respectively.

Lastly, results are given for a simulation of emission characteristics of white light-emitting devices of tunable color temperature, obtained as a result of a combination of a white LED that emits cool white light and a white LED that emits warm white light.

Table 11 illustrates results of a simulation of emission characteristics of a white light-emitting device S-6 that emits combined light obtained through complete mixing of cool white light emitted by B-10 and warm white light emitted by B-2. The simulation method is the same as in the case of the above-described white light-emitting device S-1. In the simulation method, emission spectra of two types of white LEDs, normalized with respect to luminous flux, are put together in various proportions to yield a combined spectrum, and the chromaticity coordinate values, correlated color temperature, Duv, Ra, R9, 580-nm intensity ratio and 640-nm intensity ratio are calculated on the basis of the combined spectrum.

TABLE 11

Spectral characteristics of simulated white light-emitting device S-6
(white LED (a): B-10; white LED (b): B-2)

| Proportion of emission spectrum of white LED (a) in combined spectrum | 1.0 | 0.9 | 0.8 | 0.7 | 0.6 | 0.5 | 0.4 | 0.3 | 0.2 | 0.1 | 0.0 |
|---|---|---|---|---|---|---|---|---|---|---|---|

TABLE 11-continued

Spectral characteristics of simulated white light-emitting device S-6
(white LED (a): B-10; white LED (b): B-2)

| | | | | | | | | | | | |
|---|---|---|---|---|---|---|---|---|---|---|---|
| Proportion of emission spectrum of white LED (b) in combined spectrum | 0.0 | 0.1 | 0.2 | 0.3 | 0.4 | 0.5 | 0.6 | 0.7 | 0.8 | 0.9 | 1.0 |
| Chromaticity x coordinate values | 0.313 | 0.322 | 0.331 | 0.340 | 0.351 | 0.362 | 0.374 | 0.387 | 0.401 | 0.417 | 0.434 |
| y | 0.327 | 0.332 | 0.338 | 0.344 | 0.350 | 0.357 | 0.364 | 0.372 | 0.381 | 0.391 | 0.401 |
| Correlated color temperature [K] | 6488 | 6019 | 5581 | 5169 | 4785 | 4428 | 4098 | 3794 | 3517 | 3265 | 3036 |
| Duv | 1.7 | 0.3 | −1.0 | −2.2 | −3.1 | −3.7 | −4.0 | −3.9 | −3.3 | −2.3 | −0.6 |
| Ra | 94 | 95 | 95 | 95 | 95 | 95 | 96 | 96 | 96 | 97 | 96 |
| R9 | 95 | 92 | 90 | 90 | 89 | 90 | 92 | 95 | 98 | 96 | 90 |
| Maximum wavelength in red spectral region [nm] | 626 | 626 | 626 | 626 | 631 | 631 | 631 | 631 | 631 | 631 | 631 |
| 580-nm intensity ratio [%] | 92 | 92 | 92 | 93 | 92 | 92 | 93 | 93 | 93 | 93 | 94 |
| 640-nm intensity ratio [%] | 105 | 107 | 107 | 107 | 109 | 108 | 108 | 107 | 105 | 104 | 102 |

As Table 11 shows, the correlated color temperature of output light of the white light-emitting device S-6 obtained by simulation exhibits changes between the correlated color temperature of B-10 and the correlated color temperature of B-2 depending on the proportion in which the emission spectrum of B-10 and the emission spectrum of B-2 are put together upon spectrum combination. The 640-nm intensity ratio of the white light-emitting device S-6 ranges from 100% to 110%, even when the correlated color temperature of output light takes on any one value within the variation range, while the special color rendering index R9 takes on a good value, of 89 to 98.

Table 12 illustrates results of a simulation of emission characteristics of a white light-emitting device S-7 that emits combined light obtained through complete mixing of the cool white light emitted by B-11 and the warm white light emitted by B-2. The simulation method is the same as in the case of the above-described white light-emitting device S-6.

TABLE 12

Spectral characteristics of simulated white light-emitting device S-7
(white LED (a): B-11; white LED (b): B-2)

| | | | | | | | | | | | |
|---|---|---|---|---|---|---|---|---|---|---|---|
| Proportion of emission spectrum of white LED (a) in combined spectrum | 1.0 | 0.9 | 0.8 | 0.7 | 0.6 | 0.5 | 0.4 | 0.3 | 0.2 | 0.1 | 0.0 |
| Proportion of emission spectrum of white LED (b) in combined spectrum | 0.0 | 0.1 | 0.2 | 0.3 | 0.4 | 0.5 | 0.6 | 0.7 | 0.8 | 0.9 | 1.0 |
| Chromaticity x coordinate values | 0.314 | 0.322 | 0.331 | 0.340 | 0.350 | 0.361 | 0.373 | 0.386 | 0.400 | 0.416 | 0.434 |
| y | 0.330 | 0.335 | 0.340 | 0.346 | 0.352 | 0.358 | 0.365 | 0.373 | 0.382 | 0.391 | 0.401 |
| Correlated color temperature [K] | 6420 | 5986 | 5574 | 5181 | 4808 | 4457 | 4127 | 3820 | 3536 | 3275 | 3036 |
| Duv | 3.0 | 1.6 | 0.2 | −1.0 | −2.0 | −2.8 | −3.3 | −3.4 | −3.0 | −2.1 | −0.6 |
| Ra | 90 | 92 | 93 | 94 | 94 | 95 | 96 | 96 | 96 | 96 | 96 |
| R9 | 45 | 54 | 63 | 69 | 76 | 82 | 86 | 89 | 90 | 91 | 90 |
| Maximum wavelength in red spectral region [nm] | — | — | — | — | — | 618 | 621 | 624 | 629 | 629 | 631 |
| 580-nm intensity ratio [%] | 108 | 107 | 106 | 105 | 102 | 101 | 99 | 98 | 97 | 95 | 94 |
| 640-nm intensity ratio [%] | 79 | 83 | 87 | 90 | 94 | 97 | 99 | 100 | 101 | 102 | 102 |

As Table 12 shows, the correlated color temperature of output light of the white light-emitting device S-7 obtained by simulation exhibits changes between the correlated color temperature of B-11 and the correlated color temperature of B-2 depending on the proportion in which the emission spectrum of B-11 and the emission spectrum of B-2 are put together upon spectrum combination. The 640-nm intensity ratio of the white light-emitting device S-7 lies between 100% and 102% when the correlated color temperature of output light is of 3036 to 3820 K; the special color rendering index R9 takes on a good value, of 89 to 91.

Table 13 illustrates results of a simulation of emission characteristics of a white light-emitting device S-8 that emits combined light obtained through complete mixing of the cool white light emitted by B-10 and the warm white light emitted by B-4. The simulation method is the same as in the case of the above-described white light-emitting device S-6.

TABLE 13

Spectral characteristics of simulated white light-emitting device S-8
(white LED (a): B-10; white LED (b): B-4)

| | | | | | | | | | | | |
|---|---|---|---|---|---|---|---|---|---|---|---|
| Proportion of emission spectrum of white LED (a) in combined spectrum | 1.0 | 0.9 | 0.8 | 0.7 | 0.6 | 0.5 | 0.4 | 0.3 | 0.2 | 0.1 | 0.0 |
| Proportion of emission spectrum of white LED (b) in combined spectrum | 0.0 | 0.1 | 0.2 | 0.3 | 0.4 | 0.5 | 0.6 | 0.7 | 0.8 | 0.9 | 1.0 |
| Chromaticity x coordinate values | 0.313 | 0.323 | 0.333 | 0.343 | 0.355 | 0.367 | 0.379 | 0.393 | 0.407 | 0.422 | 0.439 |
| y | 0.327 | 0.332 | 0.338 | 0.343 | 0.350 | 0.356 | 0.363 | 0.371 | 0.379 | 0.387 | 0.396 |
| Correlated color temperature [K] | 6488 | 5964 | 5483 | 5042 | 4636 | 4266 | 3931 | 3630 | 3360 | 3118 | 2903 |
| Duv | 1.7 | −0.2 | −2.0 | −3.5 | −4.7 | −5.6 | −6.1 | −6.2 | −5.7 | −4.8 | −3.4 |
| Ra | 94 | 95 | 96 | 96 | 95 | 95 | 95 | 94 | 92 | 90 | 88 |
| R9 | 95 | 97 | 97 | 93 | 89 | 83 | 75 | 66 | 57 | 47 | 37 |
| Maximum wavelength in red spectral region [nm] | 626 | 624 | 618 | 618 | 618 | 615 | 615 | 615 | 613 | 611 | 611 |
| 580-nm intensity ratio [%] | 92 | 94 | 96 | 98 | 99 | 101 | 103 | 104 | 106 | 108 | 110 |
| 640-nm intensity ratio [%] | 105 | 104 | 102 | 100 | 99 | 96 | 93 | 91 | 88 | 85 | 82 |

As Table 13 shows, the correlated color temperature of output light of the white light-emitting device S-8 obtained by simulation exhibits changes between the correlated color temperature of B-10 and the correlated color temperature of B-4 depending on the proportion in which the emission spectrum of B-10 and the emission spectrum of B-4 are put together upon spectrum combination. The 640-nm intensity ratio of the white light-emitting device S-8 lies between 100% and 105% when the correlated color temperature of output light is of 5042 to 6488 K; the special color rendering index R9 takes on a good value, of 93 to 97.

This application claims the benefit of Japanese Patent Application No. 2010-145095 filed Jun. 25, 2010, Japanese Patent Application No. 2010-179063 filed Aug. 9, 2010, and Japanese Patent Application No. 2010-279901 filed Dec. 15, 2010 which are hereby incorporated by reference herein their entirety.

EXPLANATION OF REFERENCE NUMERALS

1 package
2 insulating substrate
3A, 3B LED chip
8 white LED
10 frame
11 partition
12A first cup
12B second cup
14A, 14B fluorescent part
20A, 20B lead electrode
30 light-emitting module
31 circuit board
34, 35 wiring layer
100 white light-emitting semiconductor device
101 SMD-type package
102 light-emitting semiconductor element
103 wavelength conversion part

What is claimed is:

1. A white light-emitting semiconductor device comprising a phosphor as a light-emitting material, and with a light-emitting semiconductor element as an excitation source of the phosphor, and said phosphor including at least a green phosphor and a wide-band red phosphor, wherein said green phosphor includes at least one type of green phosphor selected from among a green phosphor that contains a crystal formed of an alkaline earth silicon oxynitride or Sialon as a base and that contains $Eu^{2+}$ as an activator, and a green phosphor that contains $Ce^{3+}$ as an activator; and an intensity at wavelength 640 nm of an emission spectrum which has been normalized with respect to luminous flux is 100-110% of the intensity at wavelength 640 nm of a spectrum of standard light for color rendering evaluation which has been normalized with respect to luminous flux.

2. The white light-emitting semiconductor device according to claim 1, wherein the correlated color temperature of emitted white light ranges from 2500 to 3500 K.

3. The white light-emitting semiconductor device according to claim 1, wherein said green phosphor includes β-Sialon:Eu.

4. The white light-emitting semiconductor device according to claim 1, wherein an emission peak wavelength of said light-emitting semiconductor element ranges from 360 to 430 nm, said phosphor further includes a blue phosphor, and
the white light-emitting semiconductor device emits white light that includes light respectively emitted by said blue phosphor, said green phosphor and said wide-band red phosphor.

5. The white light-emitting semiconductor device according to claim 4, wherein said light-emitting semiconductor element is an InGaN-based LED element, the emission peak wavelength of which ranges from 405 to 415 nm.

6. The white light-emitting semiconductor device according to claim 4, wherein said blue phosphor includes an alkaline earth halophosphate phosphor activated by $Eu^{2+}$.

7. The white light-emitting semiconductor device according to claim 1, wherein the emission peak wavelength of said light-emitting semiconductor element ranges from 430 to 470 nm.

8. The white light-emitting semiconductor device according to claim 1, wherein
said phosphor further includes a yellow phosphor, and
the white light-emitting semiconductor device emits white light that includes at least light respectively emitted by said green phosphor, said yellow phosphor and said wide-band red phosphor.

9. The white light-emitting semiconductor device according to claim 1, wherein said wide-band red phosphor includes $(CaAlSiN_3)_{1-x}(Si_{(3n+2)/4}N_nO)_x$:Eu.

10. A white light-emitting semiconductor device, comprising:
a first and second white light-emitting units, each of which includes a phosphor as a light-emitting material, and a light-emitting semiconductor element as an excitation source of the phosphor, and said phosphor includes at least a green phosphor and a wide-band red phosphor, wherein
in each of said first and second white light-emitting units, an intensity at wavelength 640 nm of an emission spectrum which has been normalized with respect to luminous flux is 100-110% of the intensity at wavelength 640 nm of a spectrum of standard light for color rendering evaluation which has been normalized with respect to luminous flux, and
the white light-emitting semiconductor device can emit combined secondary white light resulting from mixing of primary white light emitted by said first white light-emitting unit and primary white light emitted by said second white light-emitting unit.

11. The white light-emitting semiconductor device according to claim 10, wherein a difference between the correlated color temperature of the primary white light emitted by said first white light-emitting unit and the correlated color temperature of the primary white light emitted by said second white light-emitting unit is 2000 K or more.

12. The white light-emitting semiconductor device according to claim 11, wherein the correlated color temperature of the primary white light emitted by said first white light-emitting unit ranges from 2500 to 3500 K, and the correlated color temperature of the primary white light emitted by said second white light-emitting unit ranges from 4500 to 7000 K.

13. A white light-emitting semiconductor device having first to N-th white light-emitting units, each of which comprises a phosphor as a light-emitting material, and a light-emitting semiconductor element as an excitation source of the phosphor, and said phosphor includes at least a green phosphor and a wide-band red phosphor, this white light-emitting semiconductor device emitting combined secondary white light resulting from mixing of primary white light respectively emitted by said first to N-th white light-emitting units, wherein
in all or part of said first to N-th white light-emitting units, said green phosphor includes at least one type of green phosphor selected from among a green phosphor that contains a crystal formed of an alkaline earth silicon oxynitride or Sialon as a base and that contains $Eu^{2+}$ as an activator, and a green phosphor that contains $Ce^{3+}$ as an activator, and
an intensity at wavelength 640 nm of a spectrum of the secondary white light which has been normalized with respect to luminous flux is 100-110% of the intensity at wavelength 640 nm of a spectrum of standard light for color rendering evaluation which has been normalized with respect to luminous flux.

14. The white light-emitting semiconductor device according to claim 13, wherein in all or part of said first to N-th white light-emitting units, the intensity at wavelength 640 nm of the emission spectrum which has been normalized with respect to luminous flux is 99% or less or 111% or more of the intensity at wavelength 640 nm of a spectrum of standard light for color rendering evaluation which has been normalized with respect to luminous flux.

* * * * *